United States Patent
Takita et al.

(10) Patent No.: US 11,488,992 B2
(45) Date of Patent: Nov. 1, 2022

(54) ACTIVE MATRIX SUBSTRATE AND METHOD FOR INSPECTING THE SAME

(71) Applicant: SHARP KABUSHIKI KAISHA, Sakai (JP)

(72) Inventors: Rikiya Takita, Sakai (JP); Akinori Kubota, Sakai (JP); Fumiki Nakano, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 184 days.

(21) Appl. No.: 16/923,753

(22) Filed: Jul. 8, 2020

(65) Prior Publication Data

US 2021/0013251 A1    Jan. 14, 2021

Related U.S. Application Data

(60) Provisional application No. 62/871,633, filed on Jul. 8, 2019.

(51) Int. Cl.
*H01L 27/146* (2006.01)

(52) U.S. Cl.
CPC .. *H01L 27/14603* (2013.01); *H01L 27/14636* (2013.01); *H01L 27/14643* (2013.01)

(58) Field of Classification Search
CPC ......... H01L 27/14603; H01L 27/14636; H01L 27/14643; H01L 27/14605; H01L 27/14658; H01L 27/14663; H01L 27/14601; H01L 27/14612; G01R 31/2601
See application file for complete search history.

(56) References Cited

U.S. PATENT DOCUMENTS

| | | | |
|---|---|---|---|
| 10,991,750 B2* | 4/2021 | Nakazawa | G01T 1/2018 |
| 2013/0048862 A1* | 2/2013 | Nakatsugawa | G01T 1/2018 |
| | | | 438/69 |
| 2015/0097258 A1 | 4/2015 | Shigetoshi | |
| 2020/0091221 A1* | 3/2020 | Nakazawa | G01T 1/2018 |
| 2021/0311578 A1* | 10/2021 | Tominaga | G06F 3/0412 |
| 2021/0373377 A1* | 12/2021 | Kim | G02F 1/1345 |

FOREIGN PATENT DOCUMENTS

| | | | | |
|---|---|---|---|---|
| CN | 112018136 A | * | 12/2020 | ......... A61B 6/4208 |
| CN | 113568199 A | * | 10/2021 | |
| JP | 2006-032385 A | | 2/2006 | |
| JP | 4535656 B2 | | 9/2010 | |
| JP | 2015-076502 A | | 4/2015 | |
| WO | WO-2020105706 A1 | * | 5/2020 | ......... G01T 1/1612 |

* cited by examiner

*Primary Examiner* — Douglas W Owens
(74) *Attorney, Agent, or Firm* — ScienBiziP, P.C.

(57) ABSTRACT

An active matrix substrate includes a pixel region including a plurality of pixels over a substrate and a frame region outside the pixel region. In the plurality of pixels, a plurality of photoelectric conversion elements are provided. In the frame region, an antistatic hole is provided. The pixel region and a portion of the frame region are covered with an insulating film, and the antistatic hole is bored through the insulating film. An antistatic wire is provided in the frame region so as to surround the pixel region, and has a surface exposed in the antistatic hole.

9 Claims, 25 Drawing Sheets

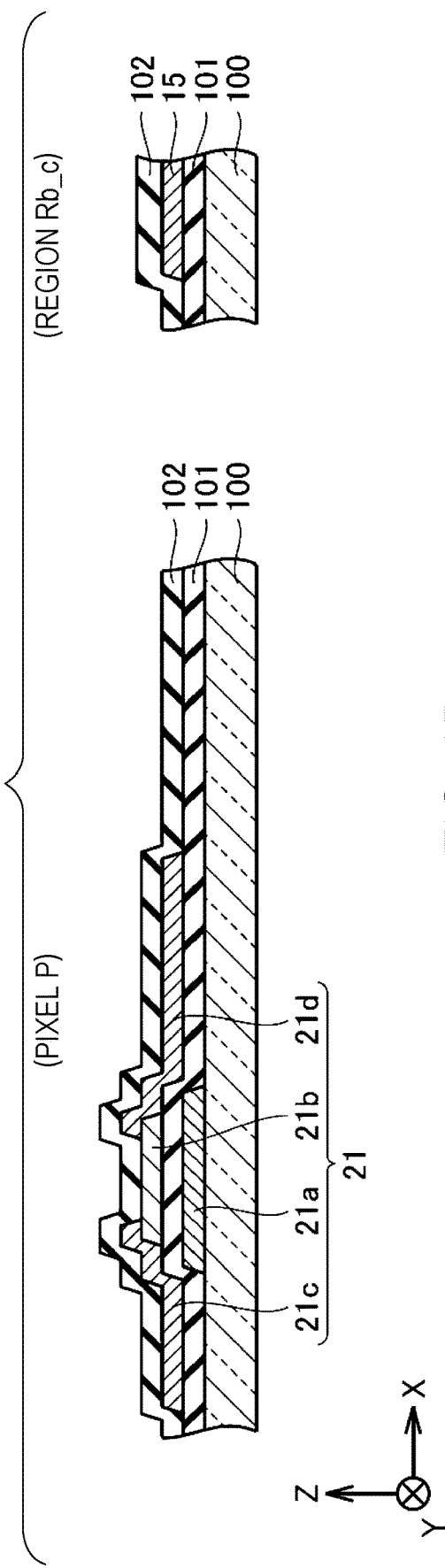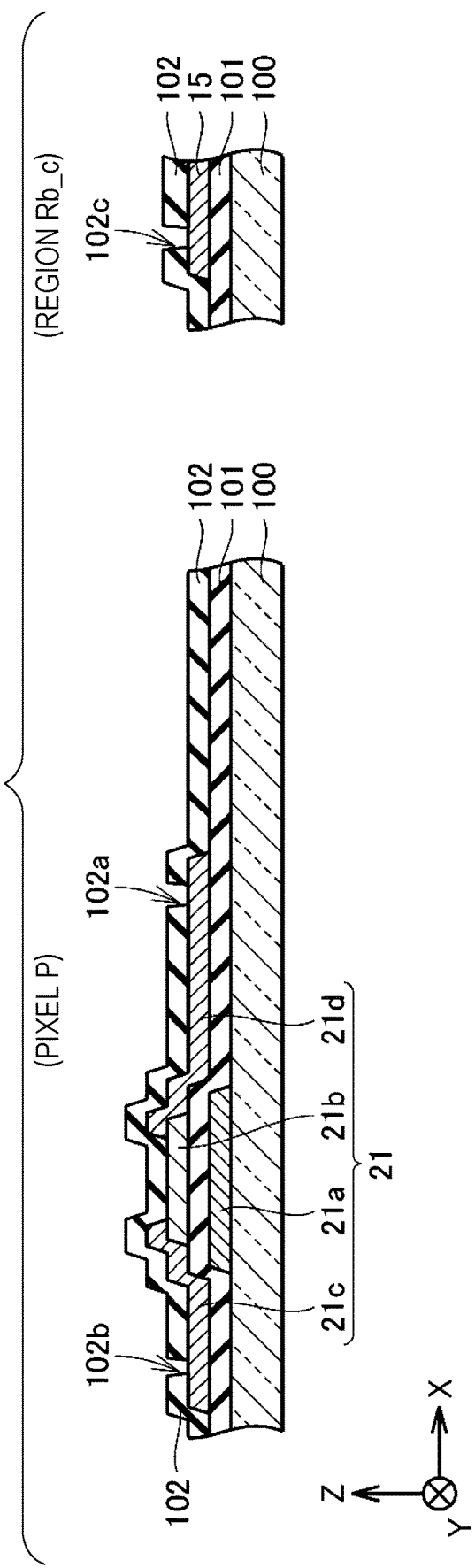

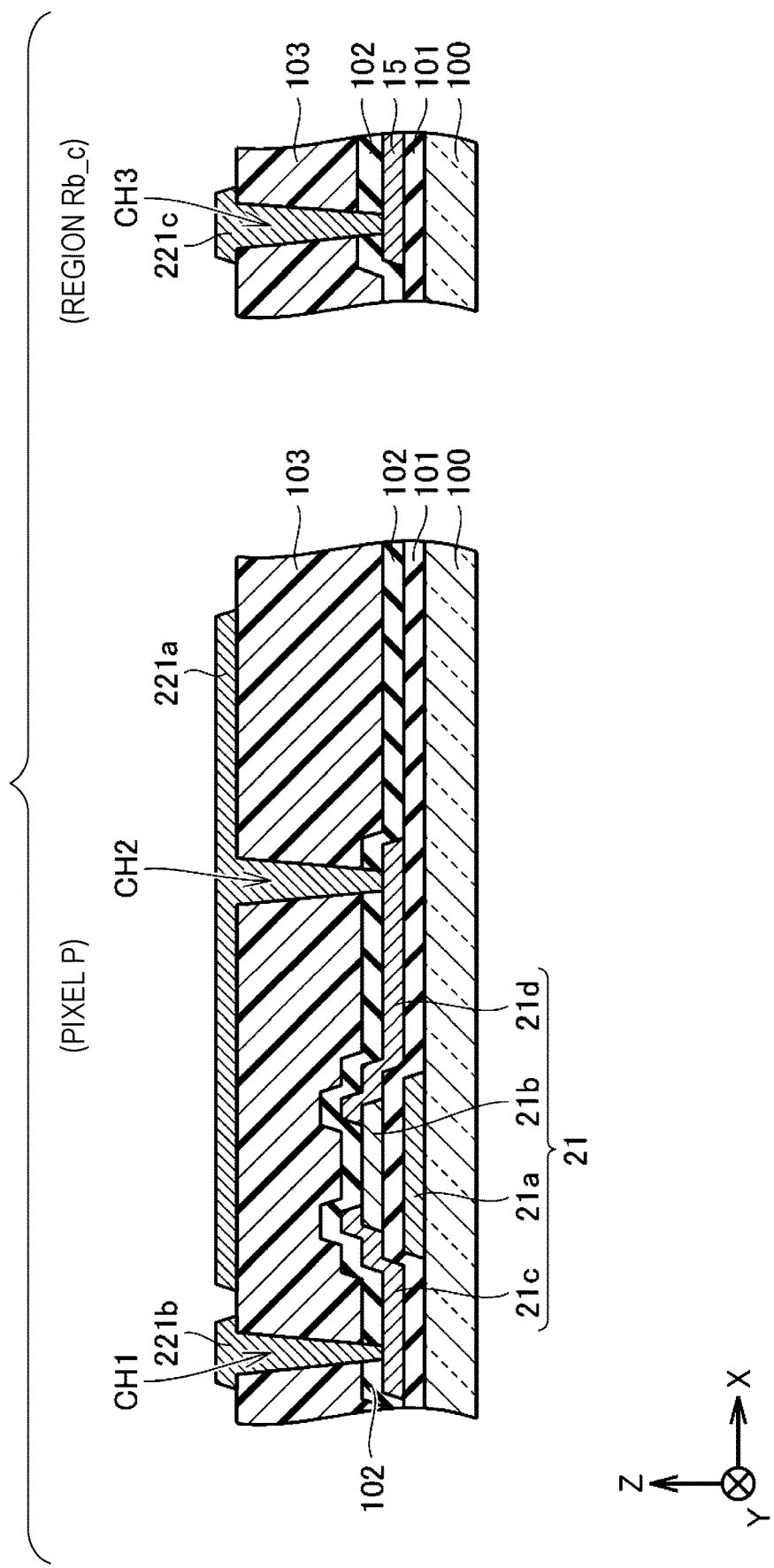

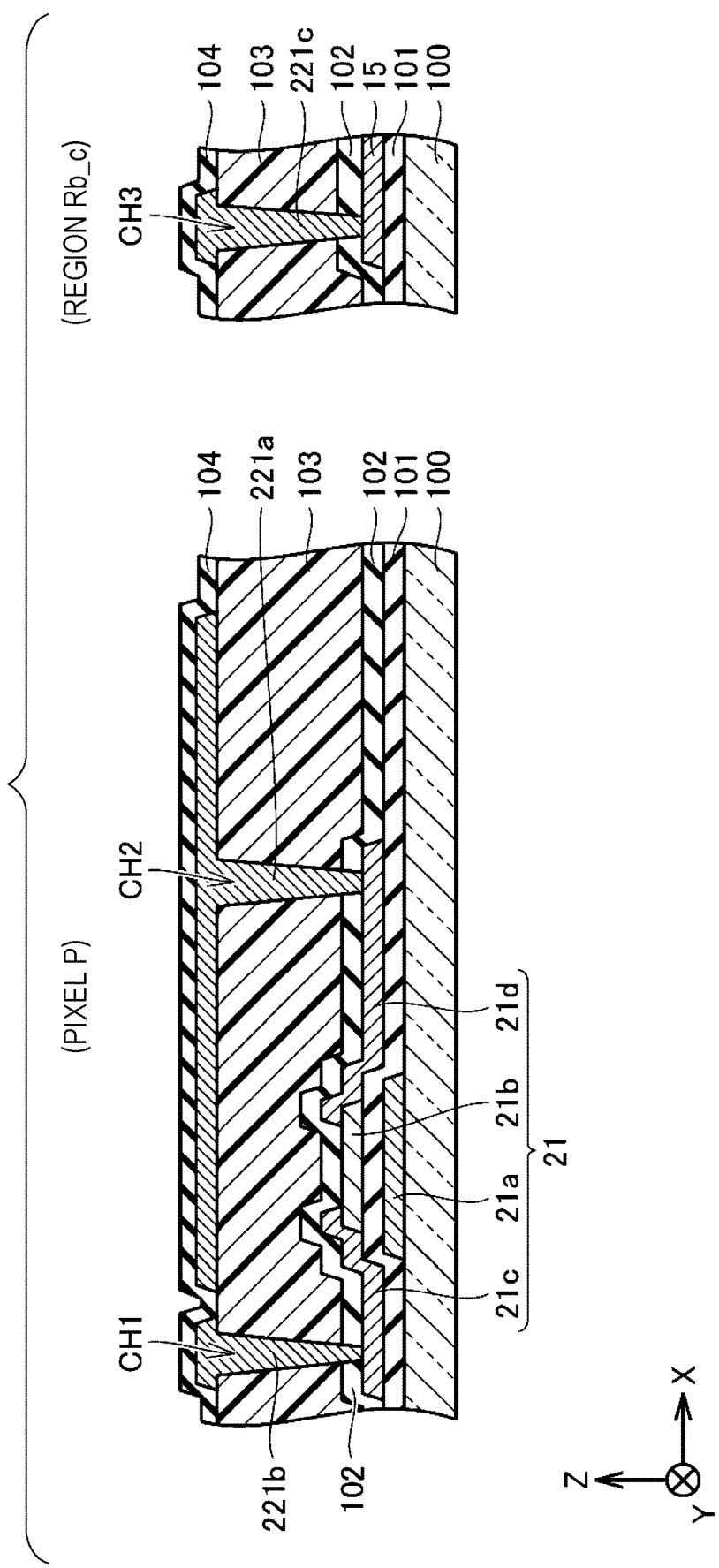

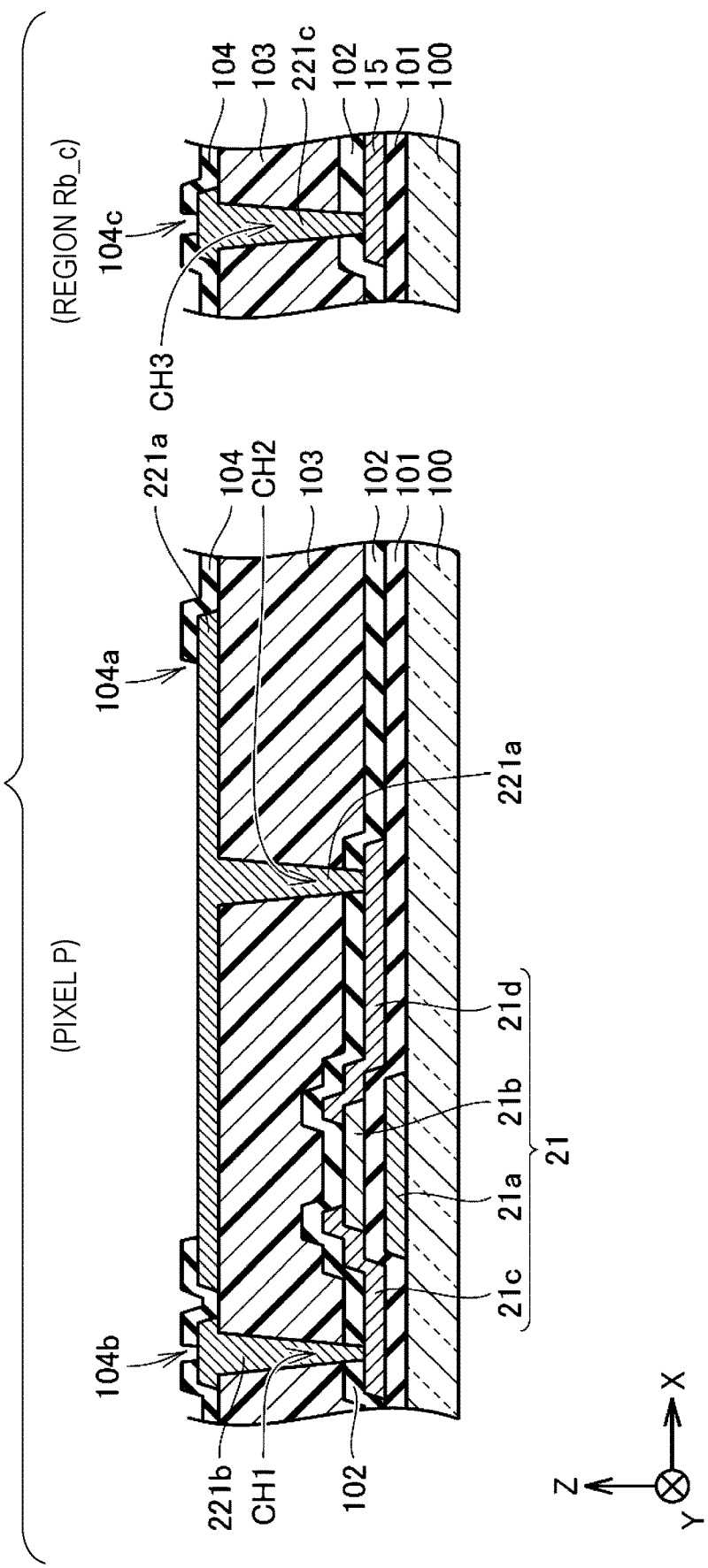

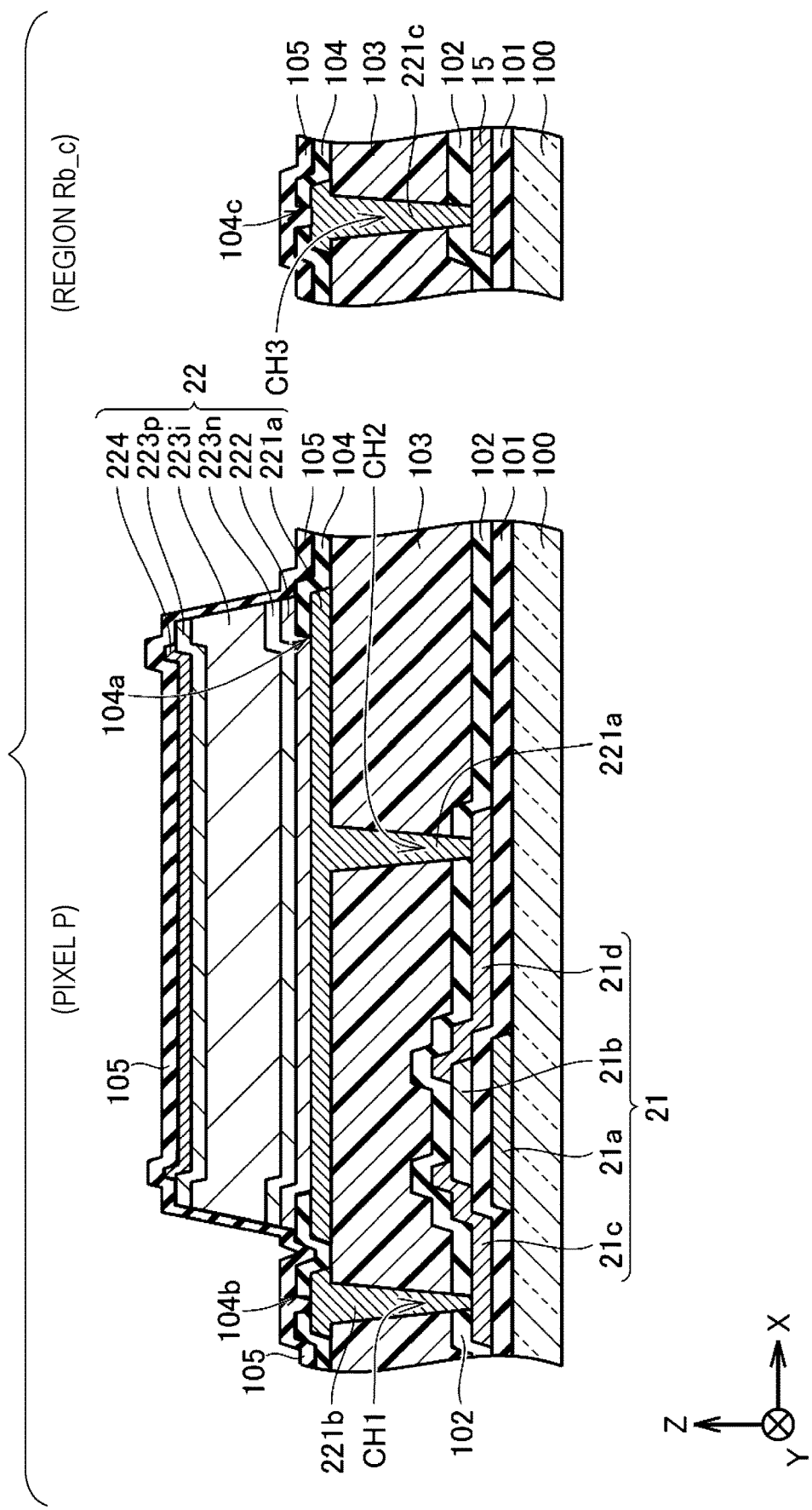

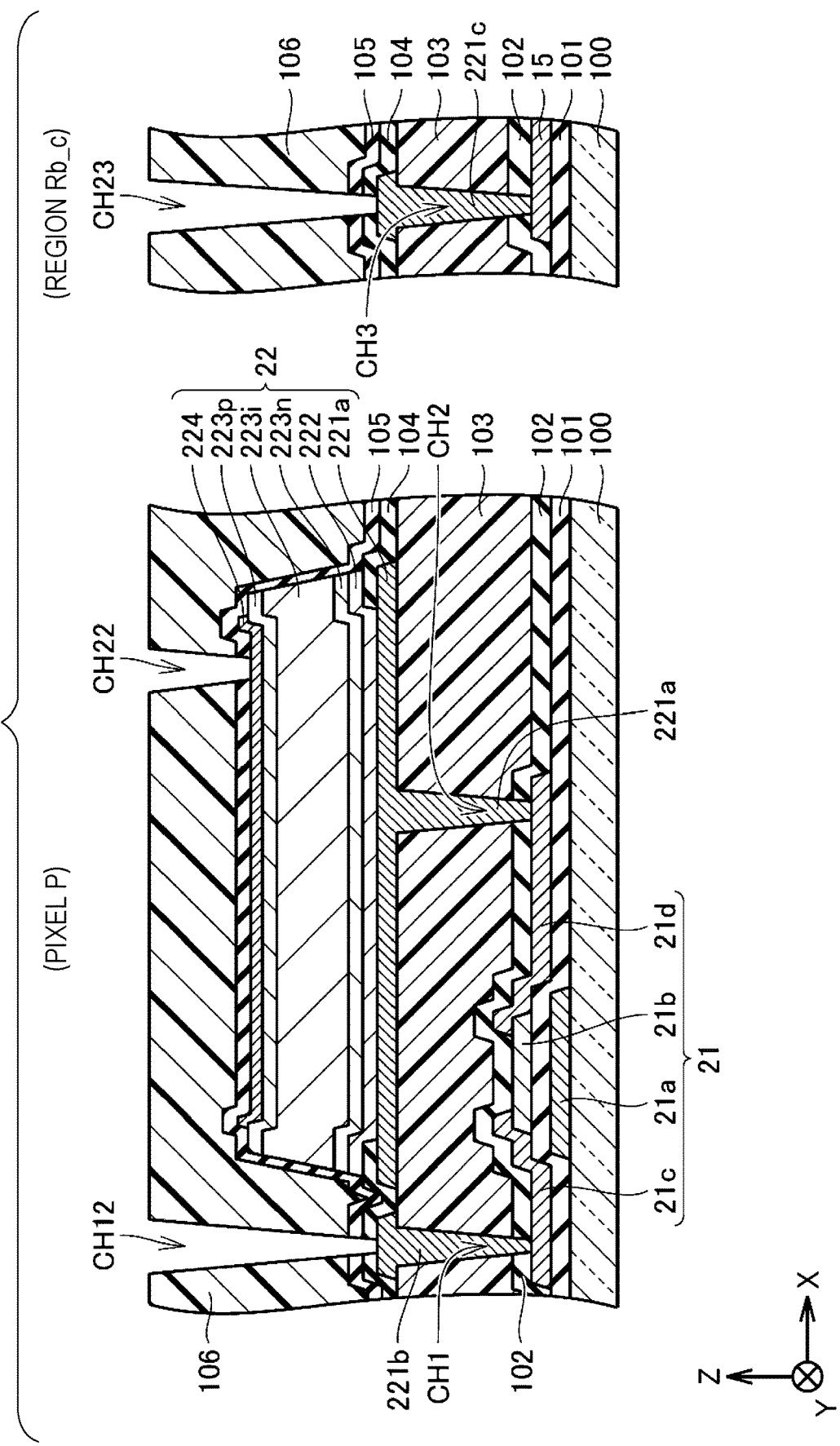

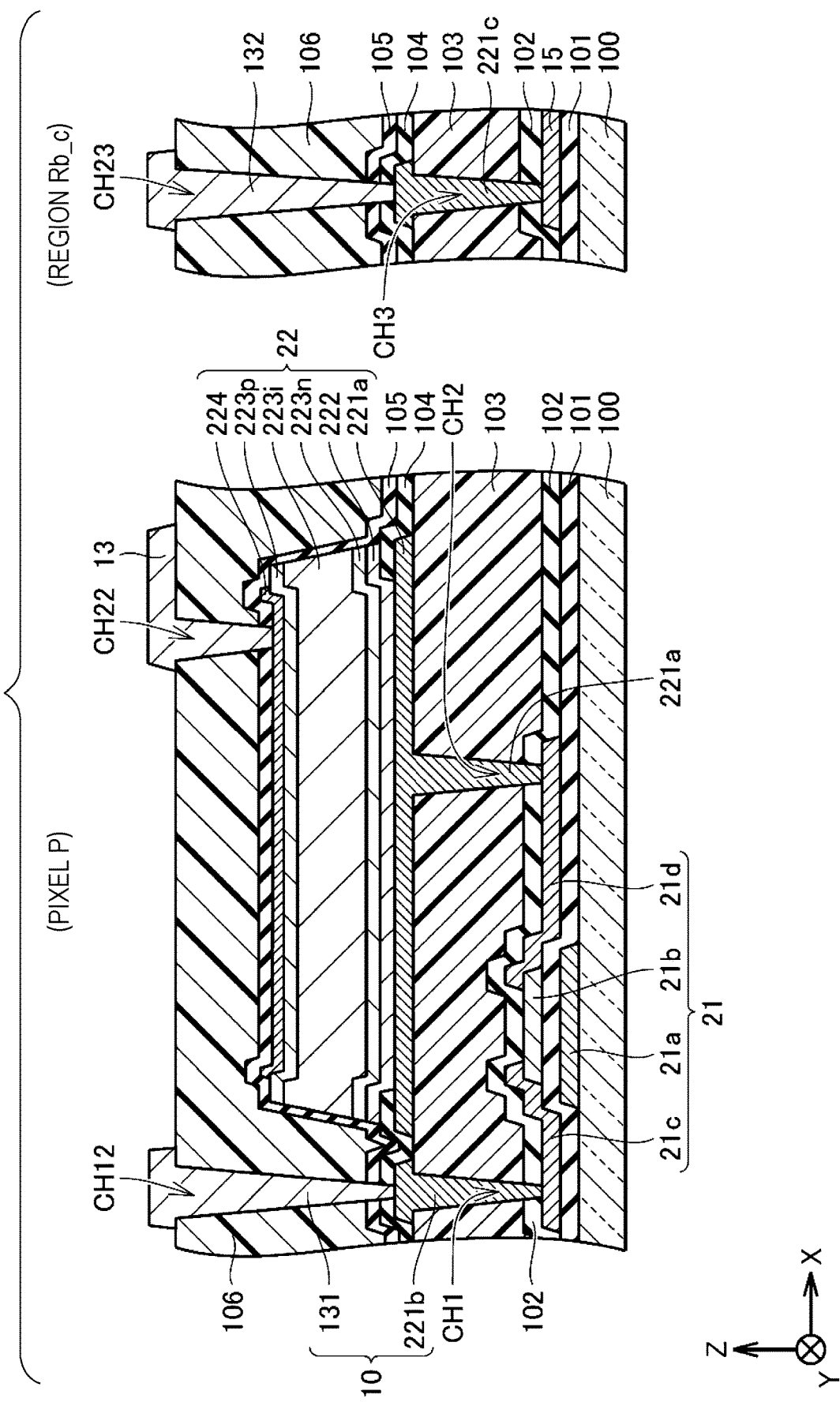

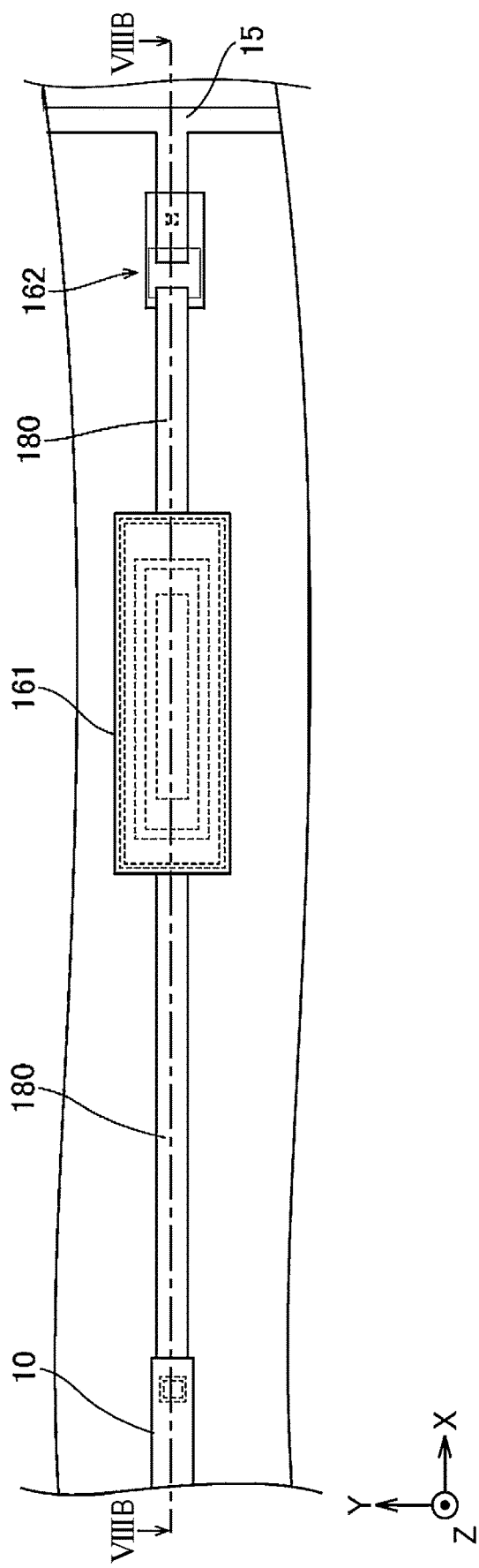

ACTIVE MATRIX SUBSTRATE AND METHOD FOR INSPECTING THE SAME

BACKGROUND

1. Field

The present disclosure relates to an active matrix substrate and a method for inspecting the same.

2. Description of the Related Art

An active matrix substrate for use in an imaging panel that images X-rays includes photoelectric conversion elements for each of a plurality of pixels formed on a substrate. For example, Japanese Unexamined Patent Application Publication No. 2006-032385 disposes a solid-state imaging apparatus that reduces dark currents. This solid-state imaging apparatus has an n-type well region formed in a p-type semiconductor substrate and a pixel array region having photodiodes two-dimensionally arrayed in the n-type well region. Formed outside the pixel array region are a plurality of well contacts to which a reference voltage is supplied and a dark current suction region provided so as to surround the periphery of the pixel array region. The plurality of well contacts are p-type well contacts, and are decentrally disposed so as to surround the dark current suction region. Although the p-type well contacts prevent a biased distribution of well potential within the pixel array region, dark currents are diffused from the p-type well contacts. Therefore, the dark current suction region is provided so as to surround the periphery of the pixel array region, and an inversely-biased voltage is applied between the pixel array region and the p-type well contacts. In this way, the dark currents diffused from the p-type well contacts into the photodiodes are absorbed by the dark current suction region.

Incidentally, in the process of manufacturing the active matrix substrate, contamination on the molecular level adheres to a surface of the active matrix substrate. Therefore, a process of cleaning the surface of the active matrix substrate with cleaning water is performed. Alternatively, in a substrate cutting step after completion of the active matrix substrate manufacturing step, a process of cleaning with cleaning water is performed for the removal of contamination and glass cullet on the molecular level. In the step of cleaning the active matrix substrate, after the cleaning water has been ejected onto the active matrix substrate, the active matrix substrate is dried with an air knife while being transported. When the active matrix substrate passes through the air knife, the cleaning water on the active matrix substrate is pushed away in a direction opposite a direction of conveyance of the active matrix substrate. In a case where the active matrix substrate is charged with static electricity or the like, the cleaning water on the active matrix substrate is charged, too. Therefore, the electric charge of the cleaning water concentrates in a region on the active matrix substrate where the cleaning water pushed away by the air knife easily accumulates. Pixels provided in the region where the electric charge of the cleaning water concentrates tend to increase in dark current of the photoelectric conversion elements.

SUMMARY

According to an aspect of the disclosure, there is provided an active matrix substrate including: a substrate; a pixel region including a plurality of pixels formed over the substrate; a plurality of photoelectric conversion elements provided in the plurality of pixels; an antistatic wire provided in a frame region outside the pixel region so as to surround the pixel region; an insulating film covering a portion of the frame region and the pixel region; and an antistatic hole bored through the insulating film in the frame region, wherein the antistatic wire has a surface exposed in the antistatic hole.

BRIEF DESCRIPTION OF THE DRAWINGS

FIG. 6A is a cross-sectional view explaining a step of manufacturing an imaging panel, and is a cross-sectional view showing a step of forming a TFT and an antistatic wire;

FIG. 6B is a cross-sectional view showing a step of forming an inorganic insulating film covering the TFT and the antistatic wire;

FIG. 6D is a cross-sectional view showing a step of forming a low-level data line, a low-level lower electrode layer, and an antistatic low-level wire after the step of FIG. 6C;

FIG. 6E is a cross-sectional view showing a step of forming an inorganic insulating film after the step of FIG. 6D;

FIG. 6F is a cross-sectional view showing a step of forming an opening of the inorganic insulating film over the low-level lower electrode shown in FIG. 6E;

FIG. 6G is a cross-sectional view showing a step of forming a high-level lower electrode, a photoelectric conversion layer, an upper electrode, and an inorganic insulating film after the step of FIG. 6F;

FIG. 6I is a cross-sectional view showing a step of forming a planarizing film after the step of FIG. 6H;

FIG. 6J is a cross-sectional view showing a step of forming a high-level data line, a bias wire, and an antistatic high-level wire after the step of FIG. 6I;

FIG. 8A is a plan view schematically showing a configuration of a portion of a second data protection circuit section shown in FIG. 7;

DESCRIPTION OF THE EMBODIMENTS

In the following, embodiments of the present disclosure are described in detail with reference to the drawings. Components that are the same as or equivalent to each other throughout the drawings are given the same reference signs and are not repeatedly described.

First Embodiment

Figure 1:
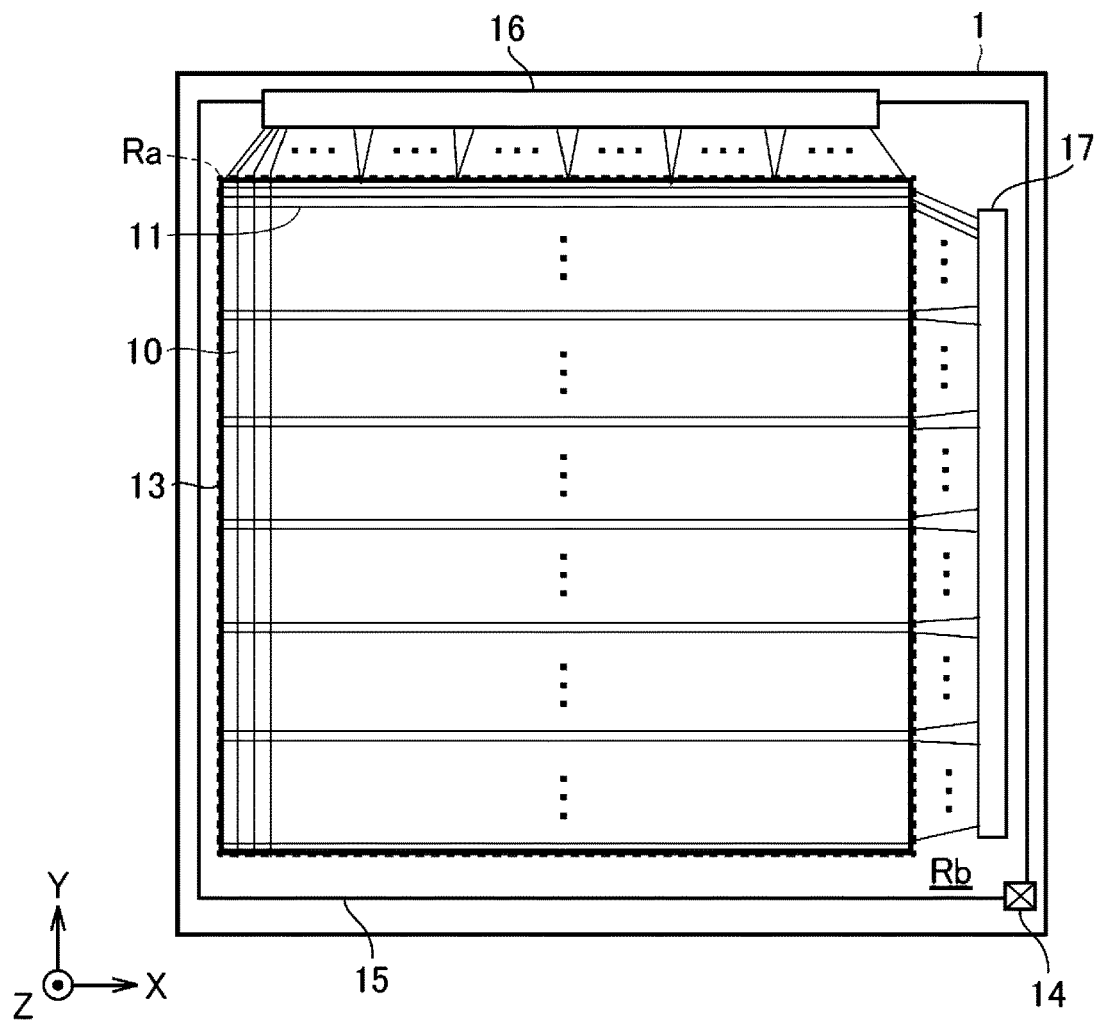
FIG. 1 is a plan view schematically showing a configuration of an imaging panel according to a first embodiment.

An active matrix substrate of the present embodiment is used, for example, in an imaging panel for imaging X-rays. The present embodiment is described by taking, as an example, an imaging panel that is to be provided with a scintillator for converting X-rays to fluorescence (scintillation light).
Configuration FIG. 1 is a plan view schematically showing a configuration of an imaging panel according to the present embodiment. As shown in FIG. 1, the imaging panel 1 includes a plurality of data lines 10 and a plurality of gate lines 11 that intersect with the plurality of data lines 10, and includes an imaging region Ra composed of regions (hereinafter referred to as "pixels") surrounded by the data lines 10 and the gate lines 11.

Inside the imaging region Ra, a bias wire 13 is disposed so as to surround the imaging region Ra. Further, although not illustrated in this drawing, each pixel is provided with a bias wire (hereinafter referred to as "branch bias wire") drawn out from the bias wire 13.

In a frame region Rb outside the imaging region Ra, an antistatic hole 14, an antistatic wire 15, and protection circuit sections 16 and 17 are provided.

The antistatic hole 14 is provided in a corner of the imaging panel 1. The antistatic hole 14 is depressed from a surface of the imaging panel 1 toward a side that a negative direction parallel to a Z axis points.

The antistatic wire 15 is provided along an outer shape of the imaging panel 1. Further, the antistatic wire 15 is disposed so as to overlap the antistatic hole 14 in plan view in a place where the antistatic hole 14 is provided.

The protection circuit section 16 is provided for the plurality of data lines 10, and includes a plurality of data terminals and a plurality of non-linear elements that will both be described later.

The protection circuit section 17 is provided for the plurality of gate lines 11, and includes a plurality of gate terminals and a plurality of non-linear elements that will both be described later.

Figure 2:
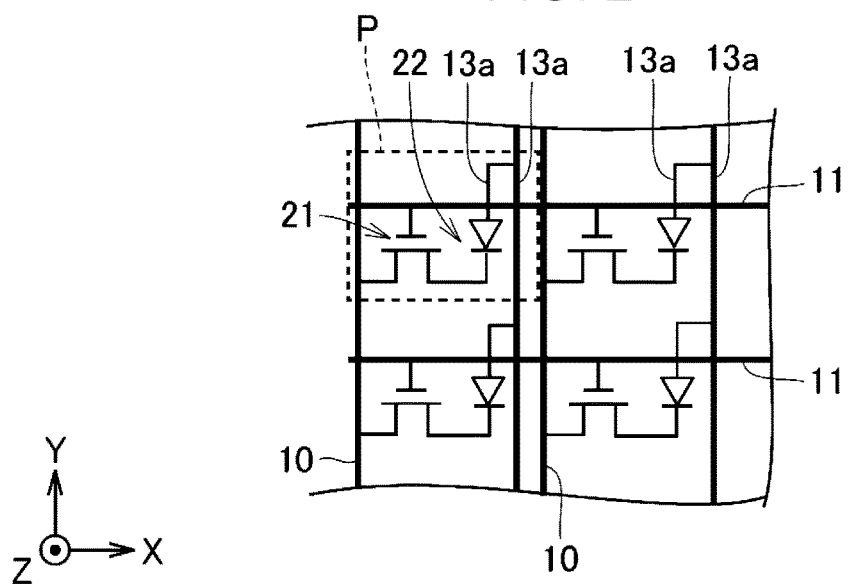
FIG. 2 is an equivalent circuit diagram of a pixel in the imaging panel shown in FIG. 1.

Next, a configuration of a pixel in the imaging region Ra is described. FIG. 2 is an equivalent circuit diagram showing a configuration of a pixel. As shown in FIG. 2, the pixel P includes a TFT (thin-film transistor) 21 and a photoelectric conversion element (photodiode) 22.

The photoelectric conversion element 22 includes a PIN photodiode and a pair of electrodes (namely, a cathode electrode and an anode electrode). The TFT 21 has its source connected to a data line 10, and has its drain connected to the cathode electrode of the photoelectric conversion element 22. The photoelectric conversion element 22 has its anode electrode connected via a contact hole to a branch bias line 13a. The contact hole is provided in an insulating film (not illustrated). The branch bias wire 13a branches off from the aforementioned bias wire 13.

In this example, the branch bias wire 13a is constituted by a principal wire disposed parallel to the data line 10 and a secondary wire branching off from the principal wire, and the photoelectric conversion element 22 has its anode electrode connected to the secondary wire.

Although not illustrated in FIG. 1 or 2, a drive circuit that scans the gate lines 11 and a readout circuit that reads out, from the data lines 10, electric charges to which scintillation light has been converted by the photoelectric conversion elements 22 are connected to the imaging panel 1. The readout circuit applies a predetermined voltage to a data line 10. When a TFT 21 connected to a gate line scanned by the drive circuit is brought into an on state, an electric signal corresponding to an electric charge converted by a pixel provided with the TFT 21 is outputted via the data line 10 to the readout circuit.

Figure 3:
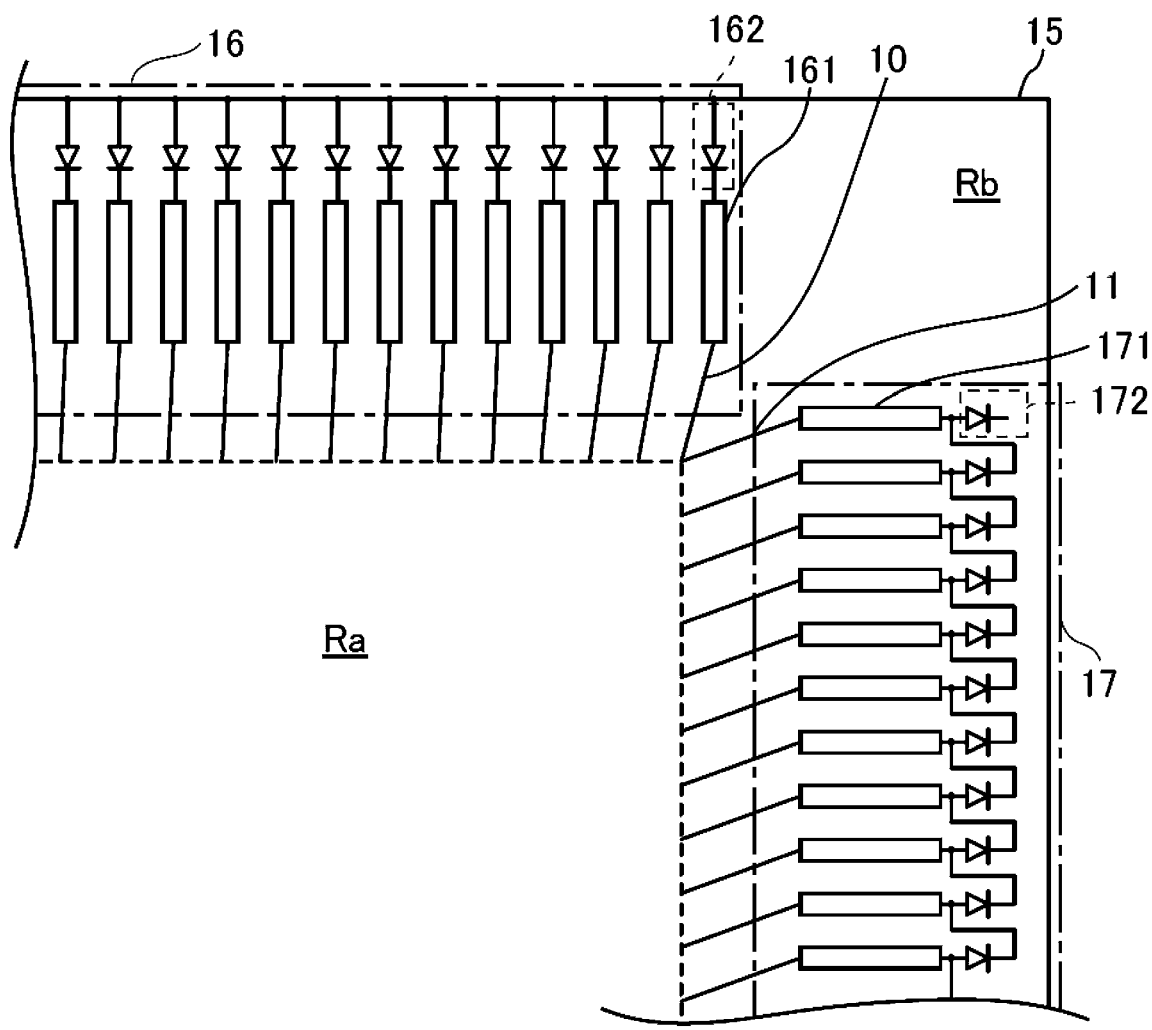
FIG. 3 is a schematic view showing a configuration of protection circuit sections shown in FIG. 1.

A configuration of the protection circuit sections 16 and 17 is described here in concrete terms. FIG. 3 is a schematic view showing a configuration of the protection circuit sections 16 and 17.

As shown in FIG. 3, the protection circuit section 16 includes a data terminal 161 and a non-linear element 162 both provided for each of the data lines 10. A plurality of the data terminals 161 are arrayed substantially parallel to a direction in which the data lines 10 are arranged.

The data terminal 161 is connected to both a data line 10 extended to the frame region Rb and the non-linear element 162.

The non-linear element 162 is constituted by a diode, a TFT, or the like. The non-linear element 162 is connected between the antistatic wire 15 and the data terminal 161 so that a direction from the antistatic wire 15 toward the data terminal 161 is a forward direction.

Further, as shown in FIG. 3, the protection circuit section 17 includes a gate terminal 171 and a non-linear element 172 both provided for each of the gate lines 11. A plurality of the gate terminals 171 are arrayed substantially parallel to a direction in which the gate lines 11 are arranged.

The gate terminal 171 is connected to both a gate line 11 extended to the frame region Rb and the non-linear element 172.

The non-linear element 172 is disposed so that a direction from the gate terminal 171 connected to it toward the non-linear element 172 is a forward direction. Further, the non-linear element 172 has its anode connected to the cathode of another non-linear element 172 that is adjacent to the non-linear element 172. Note, however, that of a plurality of the non-linear elements 172, non-linear elements 172 provided at both ends have their cathodes in a floating state.

In the manufacturing process, the imaging panel 1 is subjected to inspection (imaging inspection) as to whether it can appropriately perform imaging. In the imaging inspection, a scanning voltage of, for example, approximately +20 V is applied to the gate lines 11 via the gate terminals 171 while the gate lines 11 are being scanned, and a non-scanning voltage of, for example, approximately −10 V is applied to the gate lines 11 via the gate terminals 171 while the gate lines 11 are not being scanned. Further, a data voltage of, for example, approximately 1 V is applied to the data lines 10 via the data terminals 161. Moreover, a bias voltage of, for example, approximately −6 V is applied to the bias wire 13. In this state, the non-linear elements 162 and the non-linear elements 172 are in an inversely-biased state. When negative static electricity flows into the data lines 10, the non-linear elements 162 are brought into a forward bias state, so that the static electricity flows through the antistatic wire 15. Further, in a case where negative static electricity that is smaller than the non-scanning voltage flows into a gate line 11, a non-linear element 172 provided for a gate line 11 adjacent to the gate line 11 becomes forwardly biased, so that the static electricity is scattered across the gate lines 11.

Figure 4:
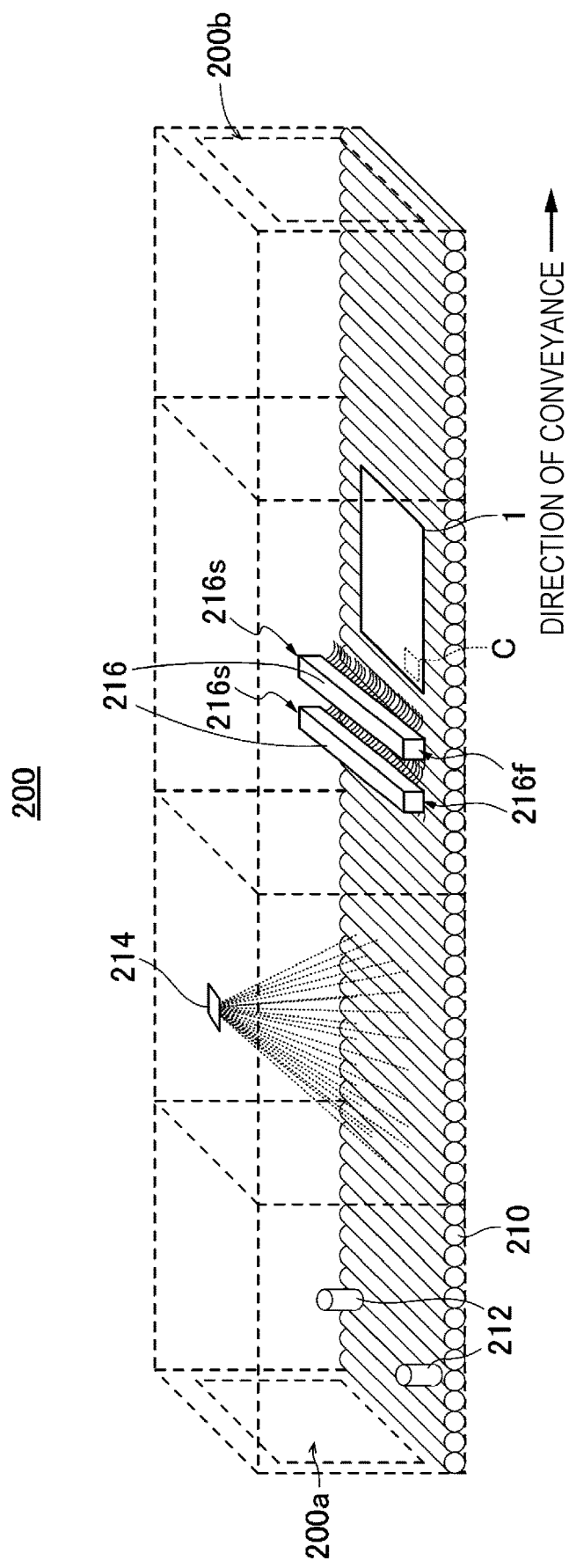
FIG. 4 is a schematic view showing an example of a cleaning process apparatus that cleans the imaging panel.

Further, in the manufacturing process, a process of cleaning the surface of the imaging panel 1 is performed. FIG. 4 is a schematic view showing an example of a cleaning process apparatus. A step of cleaning the imaging panel 1 is described below with reference to FIG. 4.

The cleaning process apparatus 200 executes a step of aligning the imaging panel 1, a cleaning water ejecting step, and a drying step in sequence. The cleaning process apparatus 200 conveys the imaging panel 1 by driving conveyor rollers 210 provided from a conveyor inlet 200a to a conveyor outlet 200b. In the aligning step, the position of the imaging panel 1 is adjusted by an alignment jig 212. The imaging panel 1, whose position has been adjusted, is sent to the cleaning water ejecting step, in which cleaning water is ejected from a shower nozzle 214 provided on an upper surface of the cleaning process apparatus 200. After the cleaning water has been ejected, the imaging panel 1 is sent to the drying step, in which the cleaning water having adhered to the imaging panel 1 is drained by air knives 216 provided over the conveyor rollers 210. After the drying by the air knives 216, the imaging panel 1 is sent to the conveyor outlet 200b.

As shown in FIG. 4, the air knives 216 are each configured by providing a rectangular haft with a fan. The rectangular haft has a longitudinal direction orthogonal to a direction of conveyance of the imaging panel 1. One end of 216f (hereinafter referred to as "first end") of each of the air knives 216 in the longitudinal direction is disposed substantially horizontal to surfaces of the conveyor rollers 210, the other end 216s (hereinafter referred to as "second end") of each of the air knives 216 in the longitudinal direction is disposed in a higher position than the first end 216f. Therefore, the first ends 216f of the air knives 216 press the surface of the imaging panel 1 with a stronger force than the second ends 216s, so that the cleaning water over the imaging panel 1 pushed out to a corner (indicated by a dotted frame C) of the imaging panel 1 that faces the first ends 216f. When the imaging panel 1 is charged with static electricity during the cleaning, the cleaning water having touched the imaging panel 1 becomes charged, too, so that the electric charge of the cleaning water adheres biasedly to a region where the cleaning water thus pushed away accumulates.

As shown in FIG. 1, the antistatic hole 14 is provided in a corner of the imaging panel 1. When the imaging panel 1 is conveyed, the imaging panel 1 is conveyed so that the antistatic hole 14 is positioned backward in the direction of conveyance and toward the first ends 216f of the air knives 216. Therefore, the cleaning water pushed out by the air knives 216 easily flows into the antistatic hole 14.

Figure 5:
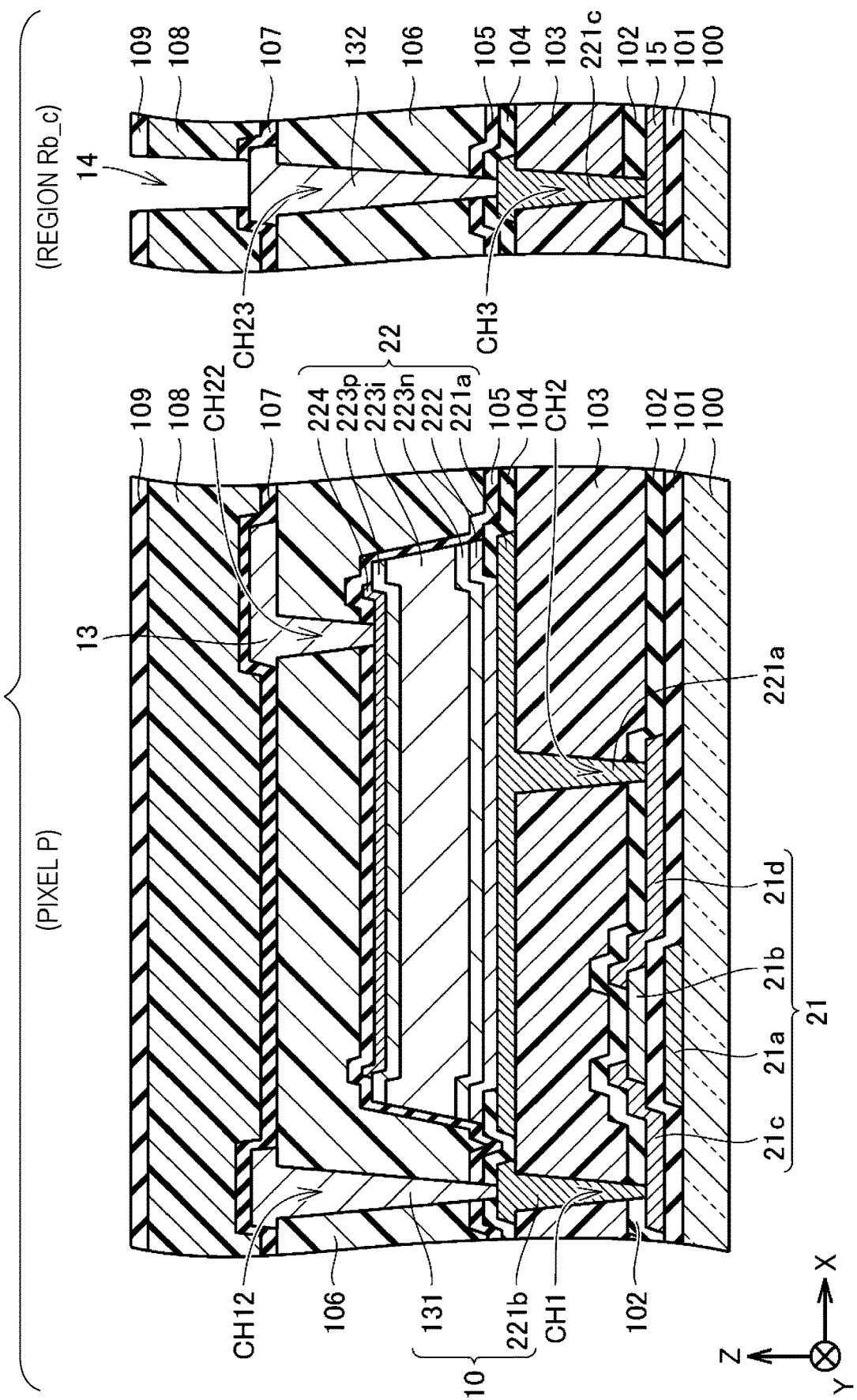
FIG. 5 illustrates schematic cross-sectional views of regions in the imaging panel where an antistatic hole and a pixel are provided.

Cross-section structures of regions in the imaging panel 1 where a pixel P and the antistatic hole 14 are provided are described here in concrete terms. FIG. 5 illustrates schematic cross-sectional views of a region (region Rb_c) in the imaging panel 1 where the antistatic hole 14 is provided and a pixel P.

As shown in FIG. 5, a gate electrode 21a is provided in a region over a substrate 100 such as a glass substrate where the pixel P is formed. The gate electrode 21a has, for example, a laminated structure in which a metal film composed of tantalum nitride (TaN) and a metal film composed of tungsten (W) are stacked in this order from the bottom. In this example, the gate electrode 21a has film thicknesses of approximately 30 nm and approximately 300 nm in this order from the lower metal film. Note, however, that the gate electrode 21a is not limited to these materials or film thicknesses.

Further, a gate insulating film 101 is provided in the pixel P and the region Rb_c so as to cover the gate electrode 21a in the pixel P. The gate insulating film 101 has, for example, a laminated structure in which an inorganic insulating film composed of silicon nitride (SiNx) and an inorganic insulating film composed of silicon oxide ($SiO_2$) are stacked in this order from the bottom. In this example, the gate insulating film 101 has film thicknesses of approximately 325 nm and approximately 10 nm in this order from the lower inorganic insulating film. Note, however, that the gate insulating film 101 is not limited to these materials or film thicknesses.

In the pixel P, an oxide semiconductor layer 21b is provided over the gate insulating film 101. The oxide semiconductor layer 21b is constituted by an oxide semiconductor layer containing indium (In), gallium (Ga), zinc (Zn), and oxygen ($O_2$) at predetermined ratios. The oxide semiconductor layer 21b has a film thickness of approximately 100 nm. The oxide semiconductor layer 21b is not limited to these materials or this film thickness.

Further, in the pixel P, a source electrode 21c and a drain electrode 21d both covering portions of the oxide semiconductor layer 21b are provided over the gate insulating film 101. Further, in the region Rb_c, the antistatic wire 15 is provided over the gate insulating film 101. The antistatic wire 15 is an example of a first wiring layer of an antistatic wire according to the present embodiment.

The source electrode 21c, the drain electrode 21d, and the antistatic wire 15 are constituted by a layer hereinafter referred to as "source-drain layer". In this example, the source-drain layer has, for example, a laminated structure in which metal films of titanium (Ti), aluminum (Al), and titanium (Ti) are stacked in this order from the bottom. The metal films of the source-drain layer SD has film thicknesses of approximately 30 nm, approximately 400 nm, and approximately 50 nm in this order from the lower metal film. The drain-source layer is not limited to these materials or film thicknesses.

In the pixel P and the region Rb_c, an inorganic insulating film 102 is provided over the source-drain layer, and a planarizing film 103 is provided over the inorganic insulating film 102. In the pixel P, contact holes CH1 and CH2 bored through the inorganic insulating film 102 and the planarizing film 103 are formed in such places as to overlap the source electrode 21c and the drain electrode 21d, respectively, in plan view. Further, in the region Rb_c, a contact hole CH3 bored through the inorganic insulating film 102 and the planarizing film 103 is formed in such a place as to overlap the antistatic wire 15 in plan view.

In this example, the inorganic insulating film 102 has, for example, a laminated structure in which an inorganic insulating film composed of silicon oxide ($SiO_2$) and an inorganic insulating film composed of silicon nitride (SiNx) are stacked in this order from the bottom. The inorganic insulating film 102 has film thicknesses of approximately 500 nm and approximately 150 nm in this order from the lower inorganic insulating film. The inorganic insulating film 102 is not limited to these materials or film thicknesses.

Further, in this example, the planarizing film 103 is constituted by a photosensitive acrylic resin, and the planarizing film 103 has a film thickness of approximately 2.5 μm. The planarizing film 103 is not limited to this material or film thickness.

In the pixel P, a low-level lower electrode 221a and a low-level data line 221b are provided over the planarizing film 103. The low-level lower electrode 221a is a portion of the cathode electrode of the photodiode 22. The low-level lower electrode 221a is connected to the drain electrode 21d via the contact hole CH2. The low-level data line 221b is connected to the source electrode 21c via the contact hole CH1. Further, in the region Rb_c, an antistatic low-level wire 221c is provided over the planarizing film 103. The antistatic low-level wire 221c is connected to the antistatic wire 15 via the contact hole CH3. The low-level lower electrode 221a, the low-level data line 221b, and the antistatic low-level wire 221c are constituted by a layer hereinafter referred to as "cathode electrode layer".

The cathode electrode layer has, for example, a laminated structure in which metal films of titanium (Ti), aluminum (Al), and titanium (Ti) are stacked in this order from the bottom. The cathode electrode layer has film thicknesses of approximately 30 nm, approximately 300 nm, and approximately 100 nm in this order from the lower metal film. The cathode electrode layer is not limited to these materials or film thicknesses.

In the pixel P and the region Rb_c, an inorganic insulating film 104 covering a portion of the cathode electrode layer is provided over the planarizing film 103.

In the pixel P, a high-level lower electrode 222 is provided over the low-level lower electrode 221a. The high-level lower electrode 222 is connected to the drain electrode 21d via the low-level lower electrode 221a. In the present embodiment, the high-level lower electrode 222 and the low-level lower electrode 221a function as the cathode electrode of the photodiode 22. The high-level lower electrode 222 is constituted by a metal film composed, for example, of titanium (Ti), and has a film thickness of approximately 30 nm. The high-level lower electrode 222 is not limited to this material or film thickness.

Further, in the pixel P, an n-type amorphous semiconductor layer 223n, an intrinsic amorphous semiconductor layer 223i, and a p-type amorphous semiconductor layer 223p are stacked in this order as a photoelectric conversion layer of the photodiode 22. The n-type amorphous semiconductor layer 223n is composed of amorphous silicon doped with an n-type impurity (e.g. phosphorus). The intrinsic amorphous semiconductor layer 223i is composed of intrinsic amorphous silicon. The p-type amorphous semiconductor layer 223p is composed of amorphous silicon doped with a p-type impurity (e.g. boron). The n-type amorphous semiconductor layer 223n, the intrinsic amorphous semiconductor layer 223i, and the p-type amorphous semiconductor layer 223p have film thicknesses of approximately 10 nm, approximately 1200 nm, and approximately 10 nm, respectively.

The n-type amorphous semiconductor layer 223n, the intrinsic amorphous semiconductor layer 223i, and the p-type amorphous semiconductor layer 223p are not limited to these materials or film thicknesses.

In the pixel P, an upper electrode 224 is provided as an node electrode over the p-type amorphous semiconductor layer 223p. The upper electrode 224 is constituted by a transparent conducting film composed of, for example, of indium tin oxide (ITO), and the upper electrode 224 has a film thickness of approximately 60 nm. The upper electrode 224 is not limited to this material or film thickness.

In the pixel P, an inorganic insulating film 105 is provided over the inorganic insulating film 104 and the photodiode 22, and a planarizing film 106 is provided over the inorganic insulating film 105. Further, in the region Rb_c, the inorganic insulating film 105 is provided over the inorganic insulating film 104, and the planarizing film 106 is provided over the inorganic insulating film 105.

Contact holes CH12, CH22, and CH23 are provided in such places as to overlap the low-level data line 221b, the upper electrode 224, and the antistatic low-level wire 221c, respectively, in plan view. The contact holes CH12 and CH22 are each bored through the inorganic insulating films 104 and 105 and the planarizing film 106. The contact hole CH23 is bored through the inorganic insulating film 105 and the planarizing film 106.

The inorganic insulating film 105 is constituted by an inorganic insulating film composed, for example, of silicon nitride (SiNx), and the inorganic insulating film 105 has a film thickness of approximately 300 nm. The inorganic insulating film 105 is not limited to this material or film thickness. The planarizing film 106 is constituted, for example, by a photosensitive acrylic resin, and the planarizing film 106 has a film thickness of approximately 2.5 μm. The planarizing film 106 is not limited to this material or film thickness.

In the pixel P and the region Rb_c, a high-level data line 131, the bias wire 13, and an antistatic high-level wire 132 are provided over the planarizing film 106. The high-level data line 131, the bias wire 13, and the antistatic high-level wire 132 are constituted by a layer hereinafter referred to as "bias wire layer".

The high-level data 131 and the low-level data line 221b are combined to form a data line 10. The high-level data line 131 is connected to the low-level data line 221b via the contact hole CH12. Further, the antistatic high-level wire 132 is connected to the antistatic low-level wire 221c via the contact hole CH23. The antistatic high-level wire 132 and the antistatic low-level wire 221c are an example of a second wiring layer of the antistatic wire according to the present embodiment.

The bias wire layer has, for example, a laminated structure in which a laminated metal film in which metal films of titanium (Ti), aluminum (Al), and titanium (Ti) are stacked and a transparent conducting film composed of indium tin oxide (ITO) are stacked in this order from the bottom. The laminated metal film and the transparent conducting film of the bias wire layer have film thicknesses of approximately 60 nm, approximately 600 nm, approximately 50 nm, and approximately 100 nm in this order from the bottom. The bias wire layer is not limited to these materials or film thicknesses.

In the pixel P and the region Rb_c, an inorganic insulating film 107 is provided over the planarizing film 106, and a planarizing film 108 is provided over the inorganic insulating film 107. Further, an inorganic insulating film 109 is provided over the planarizing film 108. In the region Rb_c, the antistatic hole 14, bored through the inorganic insulating film 107, the planarizing film 108, and the inorganic insulating film 109, is provided in such a place as to overlap the antistatic high-level wire 132 in plan view. The antistatic high-level wire 132 has a surface exposed inside the antistatic hole 14.

In this example, the inorganic insulating film 107 is constituted by an inorganic insulating film composed, for example, of silicon nitride (SiNx), and the inorganic insulating film 107 has a film thickness of approximately 400 nm. In this example, the planarizing film 108 is constituted, for example, by a photosensitive acrylic resin, and the planarizing film 108 has a film thickness of approximately 3.0 µm. Further, in this example, the inorganic insulating film 109 is constituted by an inorganic insulating film composed, for example, of silicon nitride (SiNx), and the inorganic insulating film 109 has a film thickness of approximately 150 nm. The inorganic insulating film 107, the planarizing film 108, and the inorganic insulating film 109 are not limited to these materials or film thicknesses, respectively.

In the step of cleaning the imaging panel 1, when positively-charged cleaning water touches the antistatic hole 14 and the electric charge enters the antistatic hole 14, the electric charge of the cleaning water is canceled out by electrons from the antistatic high-level wire 132, the antistatic low-level wire 221c, and the antistatic wire 15. Further, when negatively-charged cleaning water touches the antistatic hole 14 and the electric charge enters the antistatic hole 14, the electric charge of the cleaning water diffuses into the antistatic high-level wire 132, the antistatic low-level wire 221c, and the antistatic wire 15.

Further, the antistatic wire 15 is set to a ground potential (0 V) as a predetermined reference voltage after the step of cleaning the imaging panel 1. In this way, the antistatic high-level wire 132, the antistatic low-level wire 221c, and the antistatic wire 15, which have been charged by the electric charge of the cleaning water, are subjected to static removal. As a result, the electric charge of the cleaning water is not biased toward a corner of the imaging panel 1, and increases in dark current of photodiodes 261 in pixels around a corner of the imaging panel 1 can be prevented.

Next, a method for manufacturing the imaging panel 1 is described. FIGS. 6A to 6H are cross-sectional views showing steps of fabricating the pixel 10 and the region Rb_c of FIG. 5.

First, the TFT 21 is formed in a region of the pixel P over the substrate 100, and the antistatic wire 15 is formed in the region Rb_c (see FIG. 6A).

Specifically, a metal film composed of tantalum nitride (TaN) and a metal film composed of tungsten (W) are formed in this order, for example, by a sputtering method over the substrate 100. Then, the metal films thus stacked are patterned by performing a photolithography method and dry etching. In this way, the gate electrode 21a of the TFT 21 is formed in the pixel P.

After that, a film of silicon nitride (SiNx) and a film of silicon oxide (SiO$_2$) are formed as inorganic insulating films in this order, for example, by a CVD (chemical vapor deposition) method. In this way, a gate insulating film 101 covering the gate electrode 21a is formed in the pixel P and the region Rb_c.

Next, a film of an oxide semiconductor containing indium (In), gallium (Ga), zinc (Zn), and oxygen (O$_2$) at predetermined ratios is formed, for example, by a sputtering method. Then, the oxide semiconductor is patterned by performing a photolithography method and dry etching. In this way, the semiconductor layer 21b overlapping the gate electrode 21a in plan view is formed in the pixel P.

After that, metal films of titanium (Ti), aluminum (Al), and titanium (Ti) are stacked in this order, for example, by a sputtering method, and the metal films thus stacked are patterned by performing a photolithography method and dry etching. Thus, in the pixel P, the source electrode 21c and the drain electrode 21d are formed over the semiconductor layer 21b, so that the TFT 21 is formed. Further, in the region Rb_c, the antistatic wire 15 is formed over the gate insulating film 101.

Then, a film of silicon oxide (SiO$_2$) is formed as an inorganic insulating film, for example, by a CVD method. In this way, the inorganic insulating film 102 covering surfaces of the source electrode 21c, the drain electrode 21d, and the oxide semiconductor layer 21b in the pixel P and covering a surface of the antistatic wire 15 in the region Rb_c is formed.

Next, the inorganic insulating film 102 is patterned by performing a photolithography method and dry etching (see FIG. 6B). Thus, in the pixel P, openings 102a and 102b are formed over the drain electrode 21d and the source electrode 21c, respectively. Further, in the region Rb_c, an opening 102c is formed over the antistatic wire 15.

Figure 6C:
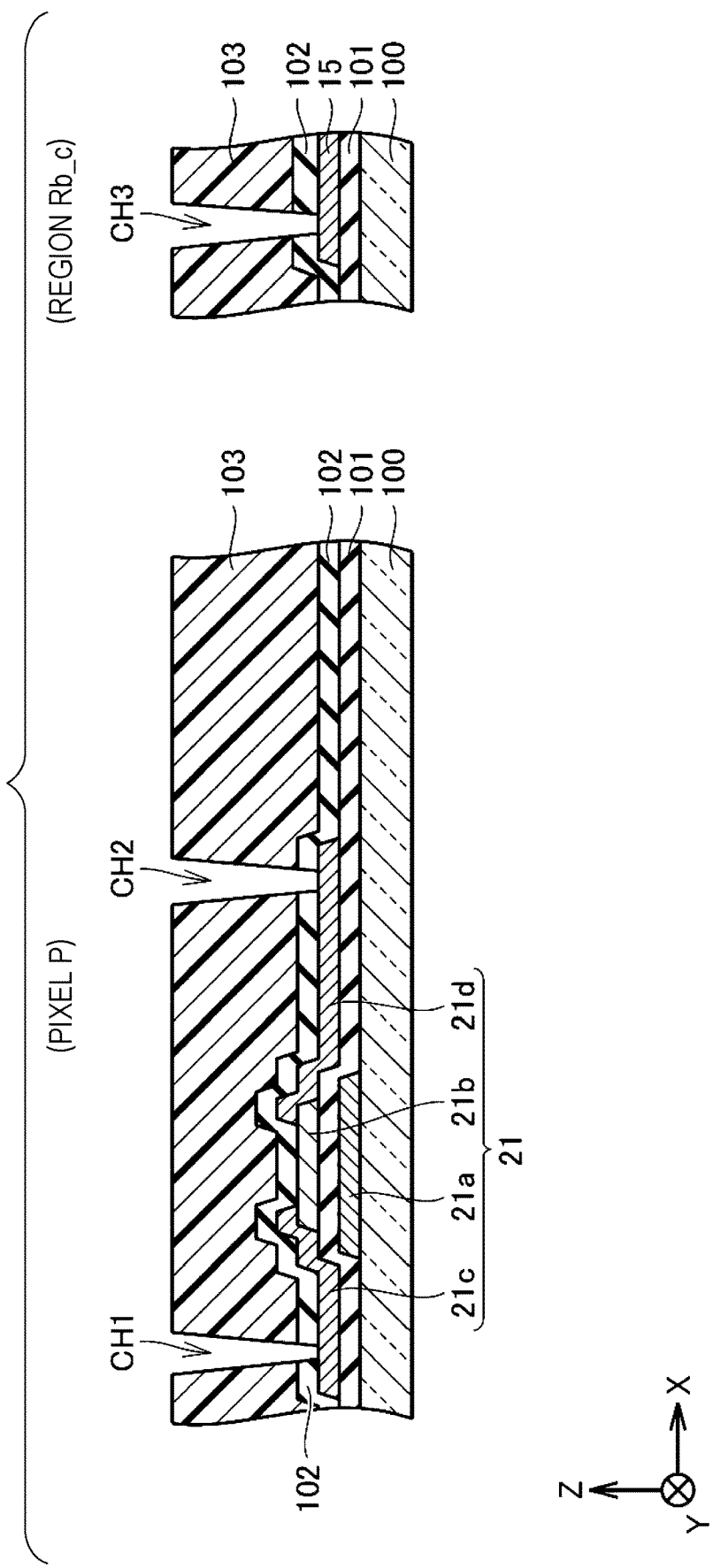
FIG. 6C is a cross-sectional view showing a step of forming a planarizing film after the step of FIG. 6B.

Then, the planarizing film 103 composed of a photosensitive acrylic resin is formed over the inorganic insulating film 102, for example, by using a slit coating method, and portions of the planarizing film 103 in places that overlap the openings 102a to 102c (see FIG. 6B) of the inorganic insulating film 102 in plan view are removed by using a photolithography method (see FIG. 6C). Thus, in the pixel P, the contact holes CH1 and CH2 bored through the planarizing film 103 and the inorganic insulating film 102 are formed, and in the region Rb_c, the contact hole CH3 bored through the planarizing film 103 and the inorganic insulating film 102 is formed.

After that, metal films of titanium (Ti), aluminum (Al), and titanium (Ti) are stacked over the planarizing film 103 in this order, for example, by a sputtering method. Then, the metal films thus stacked are patterned by performing a photolithography method and dry etching (see FIG. 6D). Thus, in the pixel P, the low-level data line 221b connected to the source electrode 21c via the contact hole CH1 and the low-level lower electrode layer 221a connected to the drain electrode 21d via the contact hole CH2 are formed. Further, in the region Rb_c, the antistatic low-level wire 221c connected to the antistatic wire 15 via the contact hole CH3 is formed.

Next, an inorganic insulating film composed of silicon nitride (SiN) is formed, for example, by a CVD method (see FIG. 6E). In this way, the inorganic insulating film 104 covering the low-level lower electrode 221a, the low-level data line 221b, and the antistatic low-level wire 221c is formed over the planarizing film 103 in the pixel P and the region Rb_c.

After that, the inorganic insulating film 104 is patterned by performing photolithography and dry etching (see FIG. 6F). In this way, openings 104a, 104b, and 104c of the inorganic insulating film 104 are formed over the low-level lower electrode 221a, the low-level data line 221b, and the antistatic low-level wire 221c, respectively.

Then, the high-level lower electrode 222, the photoelectric conversion layer (223n, 223i, and 223p), the upper electrode 224, and the inorganic insulating film 105 are formed (see FIG. 6G). Specifically, the high-level lower electrode 222 is formed by forming a metal film composed of titanium (Ti) over the inorganic insulating film 104, for example, by a sputtering method and then performing a photolithography method and dry etching. After the high-level lower electrode 222 has been formed, the n-type amorphous semiconductor layer 223n, the intrinsic amorphous semiconductor layer 223i, and the p-type amorphous semiconductor layer 223p are formed in this order as the photoelectric conversion layer, for example, by using a CVD method. The upper electrode 224 is formed by forming a film of indium tin oxide (ITO) over the p-type amorphous semiconductor layer 223p, for example, by a sputtering method and then performing a photolithography method and wet etching. After the upper electrode 224 has been formed, the photoelectric conversion layer (223n, 223i, and 223p) is patterned by performing a photolithography method and dry etching. In this way, the photodiode 22 is formed. The inorganic insulating film 105 is formed by forming a film of silicon nitride (SiNx), for example, by using a CVD method so as to cover the photodiode 22.

Figure 6H:
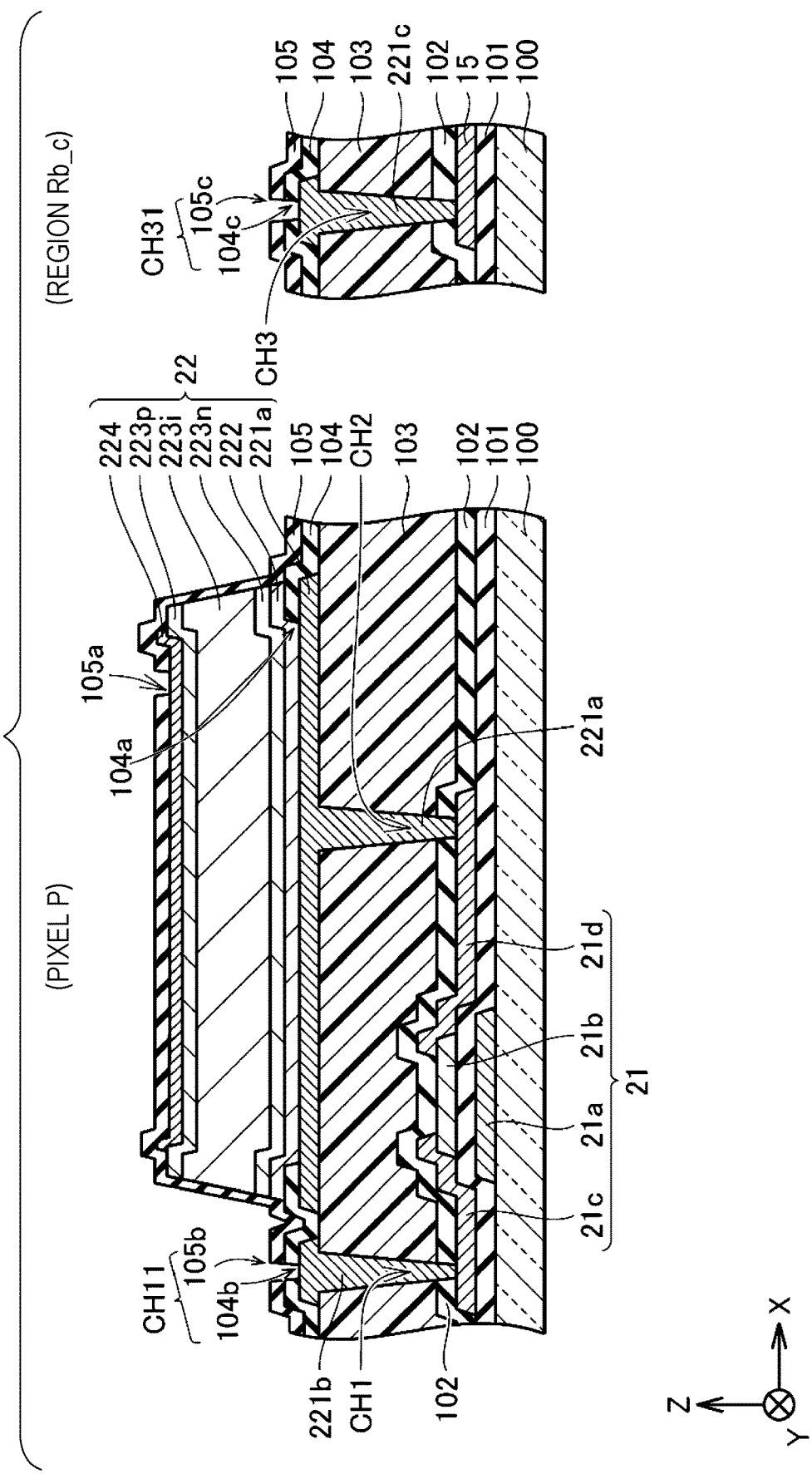
FIG. 6H is a cross-sectional view showing a step of forming an opening over the low-level data line and the antistatic low-level wire shown in FIG. 6G.

After that, the inorganic insulating film 105 is patterned, for example, by performing a photolithography method and dry etching (see FIG. 6H). Thus, in the pixel P, an opening 105a of the inorganic insulating film 105 is formed over the upper electrode 224, and an opening 105b bored through the inorganic insulating film 105 over the low-level data line 221b is formed, so that a contact hole ch11 composed of the openings 104b and 105b is formed. Further, in the region Rb_c, an opening 105c bored through the inorganic insulating film 105 over the antistatic low-level wire 221c is formed, so that a contact hole ch31 composed of the openings 104c and 105c is formed.

Then, the planarizing film 106 composed of a photosensitive acrylic resin is formed over the inorganic insulating film 105, for example, by using a slit coating method. Portions of the planarizing film 106 in places that overlap the opening 105a and the contact holes ch11 and ch31 in FIG. 6H in plan view are removed by using a photolithography method (see FIG. 6I). Thus, in the pixel P, a contact hole CH12 and a contact hole CH22 are formed over the low-level data line 221b and the upper electrode 224, respectively. Further, in the region Rb_c, a contact hole CH23 is formed over the antistatic low-level wire 221c.

After that, the high-level data line 131 and the bias wire 13 are formed over the planarizing film 106 in the pixel P, and the antistatic high-level line 132 is formed over the planarizing film 106 in the region Rb_c (see FIG. 6J). Specifically, after metal films of titanium (Ti), aluminum (Al), and titanium (Ti) have been formed in this order over the planarizing film 106, for example, by using a sputtering method, a photolithography method and dry etching are performed. In this way, the high-level data line 131, the bias wire 13, and the antistatic high-level wire 132 are simultaneously formed. The high-level data line 131 is connected to the low-level data line 221b via the contact hole CH12, so that the data line 10 composed of the low-level data line 221b and the high-level data line 131 is formed. The bias wire 13 is connected to the upper electrode 224 via the contact hole CH22. Further, the antistatic high-level wire 132 is connected to the antistatic low-level wire 221c in the contact hole CH23.

Figure 6K:
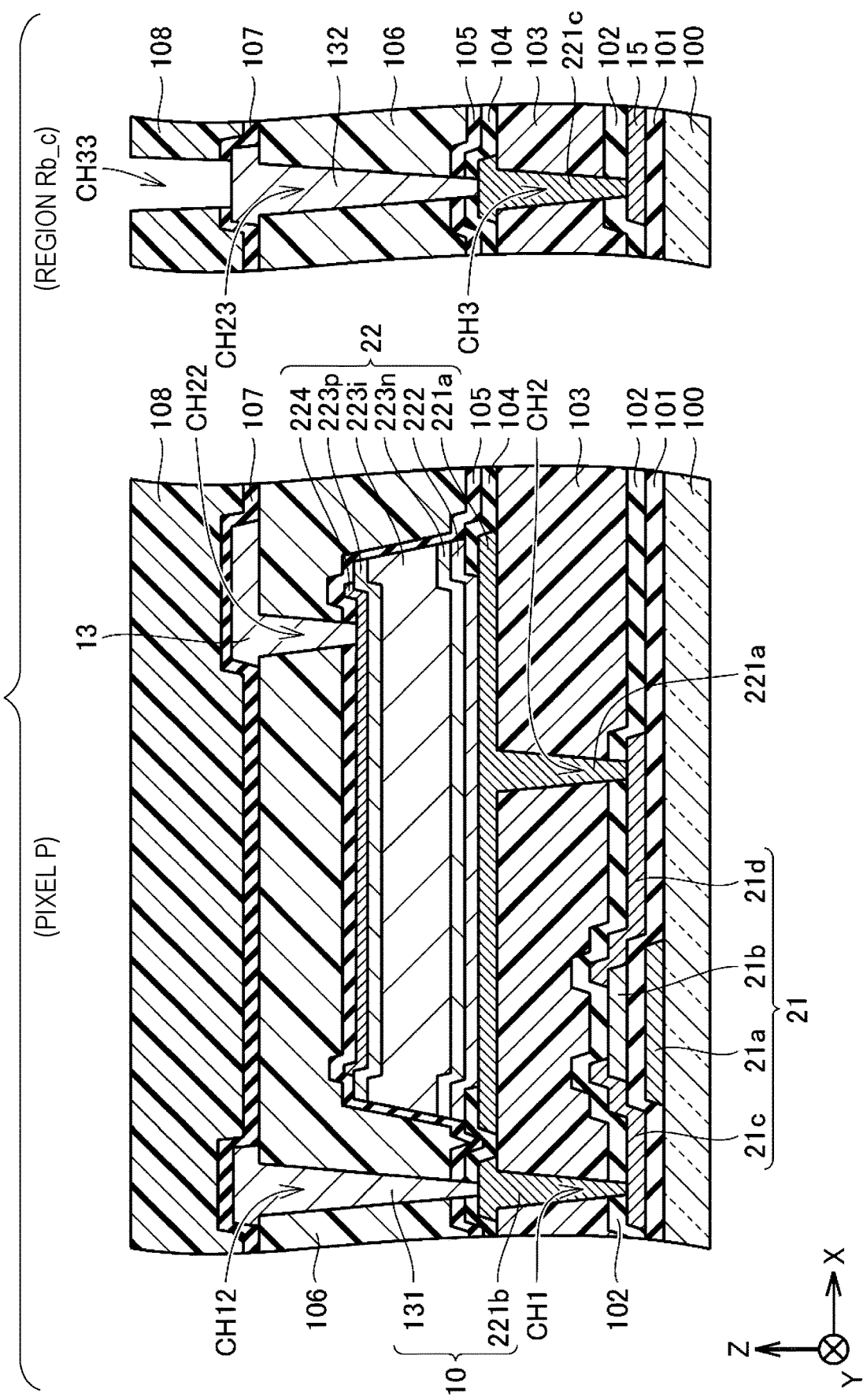
FIG. 6K is a cross-sectional view showing a step of forming an inorganic insulating film and a planarizing film in this order after the step of FIG. 6J.

Next, the inorganic insulating film 107 and the planarizing film 108 are formed in this order (see FIG. 6K). The inorganic insulating film 107 is formed by forming a film of silicon nitride (SiNx) over the bias wire layer, for example, by a CVD method and then performing a photolithography method and dry etching. The planarizing film 108 is formed by forming a film of photosensitive acrylic resin over the inorganic insulating film 107, for example, by a slit coating method and then removing a portion of the photosensitive acrylic resin by using a photolithography method. Thus, in the region Rb_c, a contact hole CH33 bored through the planarizing film 108 and the inorganic insulating film 107 is formed over the antistatic high-level wire 132.

Figure 6L:
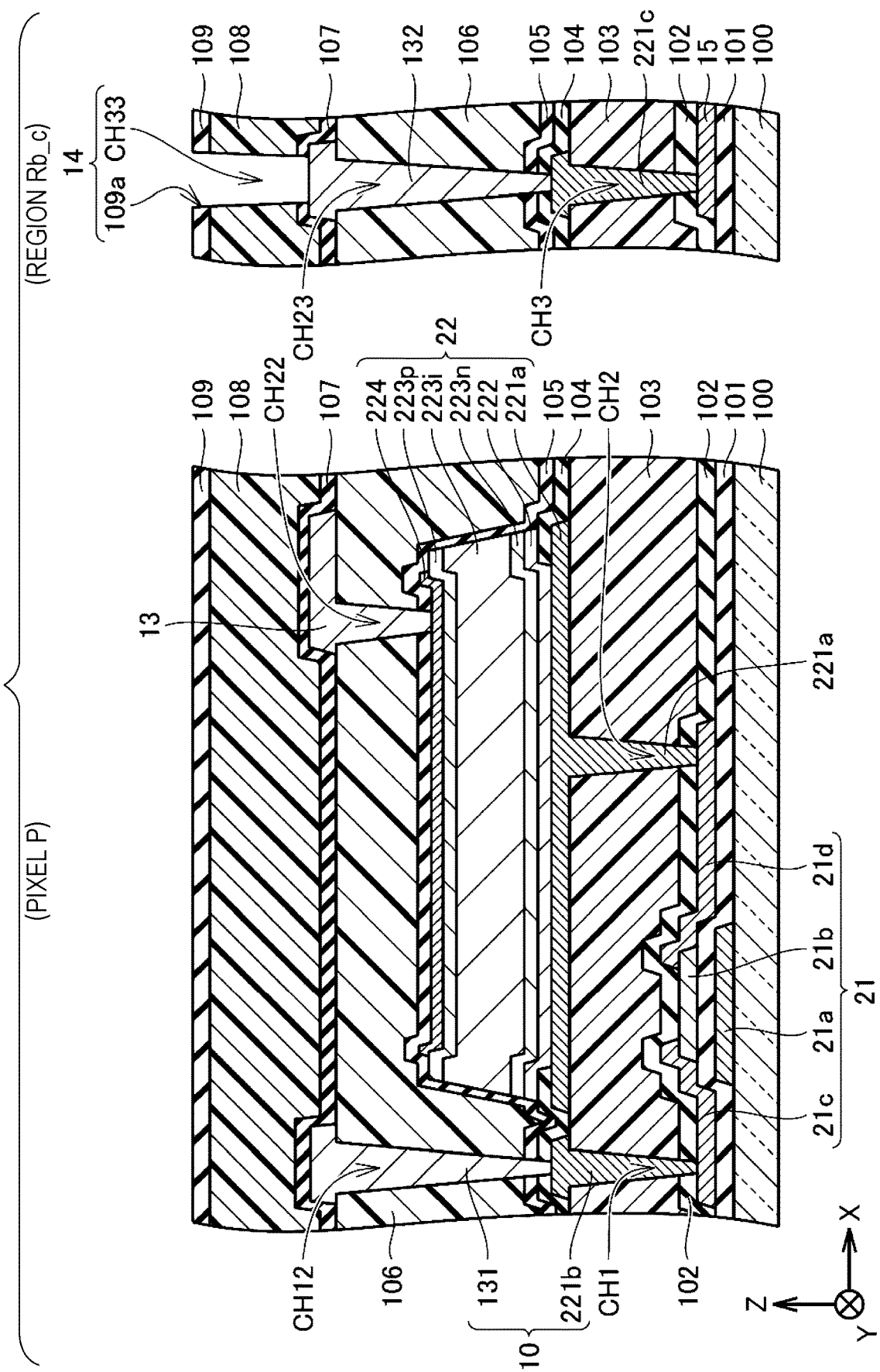
FIG. 6L is a cross-sectional view showing a step of forming an inorganic insulating film after the step of FIG. 6K.

Then, an inorganic insulating film composed of silicon nitride (SiNx) is formed over the planarizing film 108, for example, by a CVD method. Then, the inorganic insulating film is patterned by performing a photolithography method and dry etching (see FIG. 6L). Thus, in the pixel P, the inorganic insulating film 109 is formed over the planarizing film 108. Further, in the region Rb_c, the inorganic insulating film 109 is formed over a portion of the planarizing film 108 excluding the contact hole CH33 in FIG. 6K, and an opening 109a of the inorganic insulating film 109 is formed in such a place as to overlap the contact hole CH33. As a result, the antistatic hole 14 composed of the contact hole CH33 and the opening 109a is formed, whereby the imaging panel 1 is fabricated.

As mentioned above, the antistatic wire 15 is formed at the same time as the source electrode 21c and the drain electrode 21d of the TFT 21 are formed. The antistatic low-level wire 221c is formed at the same time as the low-level lower electrode 221a and the low-level data line 221b. Further, the antistatic high-level wire 132 is formed at the same time as the bias wire 13 and the high-level data line 131. In this way, the antistatic wire 15, the antistatic low-level wire 221c, and the antistatic high-level wire 132 are fabricated in the step of forming the TFT 21 and the bias wire 13 in the pixel P. That is, there is no need to provide a separate step of fabricating the antistatic wire 15, the antistatic low-level wire 221c, and the antistatic high-level wire 132, which remove the electric charge of cleaning water that flows into the antistatic hole 14. This makes it possible to, without increasing the number of steps of manufacturing the imaging panel 1, prevent a biased charge of cleaning water that adheres to the imaging panel 1 and prevent increases in dark current of the photodiodes 261 due to the electric charge of the cleaning water.

Second Embodiment

Figure 7:
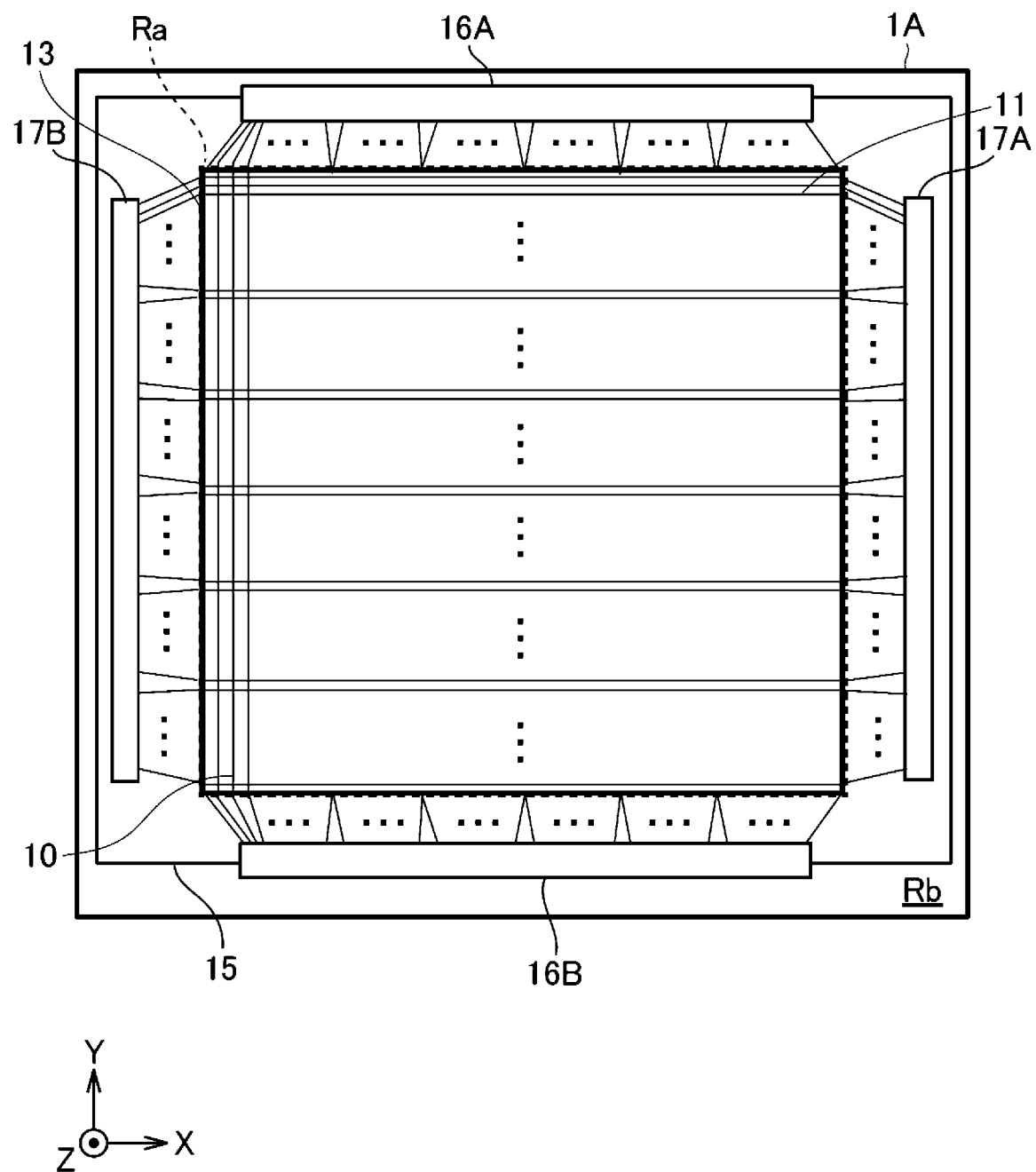
FIG. 7 is a plan view schematically showing a configuration of an imaging panel according to a second embodiment.

A second embodiment illustrates an imaging panel which is different from that of the first embodiment in terms of a structure for preventing a biased charge of cleaning water that adheres to the imaging panel. FIG. 7 is a schematic plan view of the imaging panel according to the present embodiment. In FIG. 7, components which are identical to those of the first embodiment are given the same reference signs as those of the first embodiment. The following describes a structure which is different from that of the first embodiment.

As shown in FIG. 7, the imaging panel 1A includes two protection circuit sections 16 and two protection circuit sections 17. These protection circuit sections 16 and 17 are identical to those of the first embodiment. One of the two protection circuit sections 16 is hereinafter referred to as "first data protection circuit section 16A", and the other as "second data protection circuit section 16B". Further, one of the two protection circuit sections 17 is hereinafter referred to as "first gate protection circuit section 17A", and the other as "second gate protection circuit section 17B".

The first data protection circuit section 16A and the second data protection section 16B are placed opposite each other across the imaging region Ra. The first gate protection circuit section 17A and the second gate protection section 17B are placed opposite each other across the imaging region Ra.

The antistatic wire 15 is disposed along sides of the imaging panel 1A in a frame region in which the first gate protection circuit section 17A and the second gate protection circuit section 17B are provided, and are connected to the first data protection circuit section 16A and the second data protection section 16B.

As is the case with the protection circuit section 16 according to the first embodiment, the first data protection circuit section 16A and the second data protection section 16B each include a data terminal 161 and a non-linear element 162 for each of the data lines 10 (see FIG. 3). As is the case with the gate protection circuit section 17 according to the first embodiment, the first gate protection circuit section 17A and the second gate protection circuit section 17B each include a gate terminal 171 and a non-linear element 172 for each of the gate lines (see FIG. 3).

In the process of manufacturing the imaging panel 1A, as in the case of the first embodiment, operation of the imaging panel 1A is checked by applying predetermined voltages to the data lines 10 and the gate lines 11 via the data terminals 161 of the first data protection circuit section 16A and the gate terminals 171 of the first gate protection circuit section 17A, respectively. The second data protection circuit section 16B and the second gate protection circuit section 17B are used as spare protection circuit sections for the first data protection circuit section 16A and the first gate protection circuit section 17A, respectively.

Next, a step of cleaning the imaging panel 1A is described. In this example, the imaging panel 1A is conveyed so that a side of the frame region along which the first data protection circuit section 16A is provided passes through air knives 216 (see FIG. 4) first. In this way, when the imaging panel 1A passes through the air knives 216, cleaning water is pushed out to a side of the frame region along which the second data protection circuit section 16B is provided. A configuration of the second data protection circuit section 16B is described here in concrete terms.

Figure 8B:
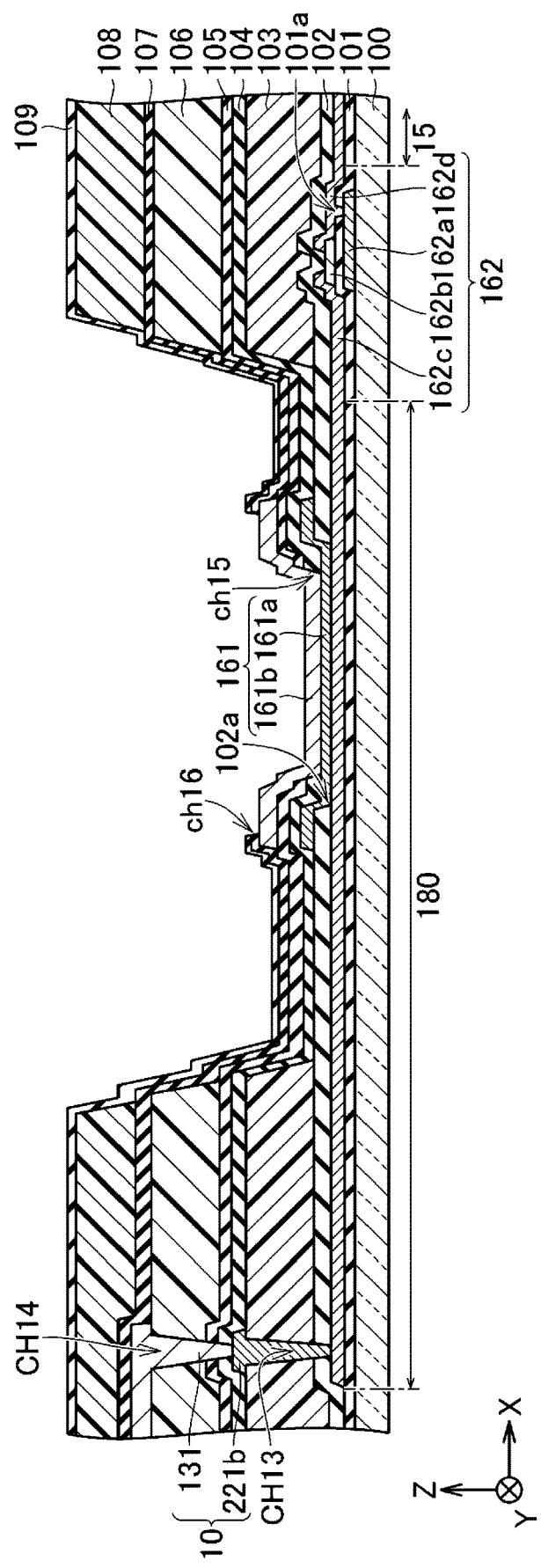
FIG. 8B is a cross-sectional view taken along line VIIIB-VIIIB shown in FIG. 8A.

FIG. 8A is a plan view showing a portion of the second data protection circuit section 16B. More specifically, FIG. 8A is a plan view schematically showing a data terminal 161 connected to a data line 10 and a non-linear element 162 connected to the data terminal 161. Further, FIG. 8B is a schematic cross-sectional view taken along line VIIIB-VIIIB shown in FIG. 8A. In FIGS. 8A and 8B, components which are the same as those of the first embodiment are given the same reference signs as those of the first embodiment.

As shown in FIG. 8A, the data terminal 161 is connected to the data line 10 and the non-linear element 162 by a wire 180.

In this example, the non-linear element 162 is constituted, for example, by an n-type TFT. As shown in FIG. 8B, a gate electrode 162a of the non-linear element 162 is provided over the substrate 100, and a semiconductor layer 162b is provided over the gate electrode 162a via the gate insulating film 101. A source electrode 162c and a drain electrode 162d placed at a spacing from each other are provided over the semiconductor layer 162b. An opening 101a of the gate insulating film 101 is formed over the gate electrode 162a, and the drain electrode 162d and the gate electrode 162a are connected to each other in the opening 101a. The non-linear element 162 is fabricated at the same time in the process of fabricating the TFT 21.

The wire 180 and the antistatic wire 15 are constituted by the same material as the source electrode 162c and the drain electrode 162d. The source electrode 162c of the non-linear element 162 and the wire 180 are integrally formed, and the drain electrode 162d of the non-linear element 162 and the antistatic wire 15 are integrally formed.

The data terminal 161 includes a first data terminal layer 161a and a second data terminal layer 161b. The first data terminal layer 161a is connected to the wire 180 in the opening 102a of the inorganic insulating film 102. The inorganic insulating films 104 and 105 are formed over portions of the first data terminal layer 161a, and an opening ch15 bored through the inorganic insulating films 104 and 105 is formed inside the opening 102a. The second data terminal layer 161b is formed over the inorganic insulating film 105 so as to be connected to the first data terminal layer 161a in the opening ch15. A opening ch16 bored through the inorganic insulating films 108 and 109 is formed over the second data terminal layer 161b, and the data terminal 161 has a surface exposed in the opening ch16.

In this example, the first data terminal layer 161a is constituted by the same material as the low-level lower electrode 221a, and the second data terminal layer 161b is constituted by the same material as the bias wire 13.

Further, the low-level data line 221b is formed in such a place over the wire 180 as not to overlap the data terminal 161 in plan view. The low-level data line 221b is connected to the wire 180 via a contact hole CH13 bored through the inorganic insulating film 102 and the planarizing film 103.

A contact hole CH14 bored through the planarizing film 106 and the inorganic insulating films 105 and 104 is formed in such a place as to overlap the low-level data line 221b in plan view. The high-level data line 131 is connected to the low-level data line 221b via the contact hole CH14.

The imaging panel 1A is cleaned in a manner similar to the first embodiment. When negatively-charged cleaning water touches the surface of the data terminal 161 of the second data protection circuit section 16B, the electric charge of the cleaning water diffuses into the antistatic wire 15 via the non-linear element 162. The antistatic wire 15 is set to a ground potential after the step of cleaning the imaging panel 1A. In this way, the antistatic wire 15, which has been charged by the electric charge of the cleaning water, is subjected to static removal. As a result, the electric charge of the cleaning water is not biased toward pixels around the second data protection circuit section 16B, and increases in dark current of the photodiodes 261 can be prevented.

Third Embodiment

A third embodiment illustrates an imaging panel which is different from those of the first and second embodiments in terms of a structure for preventing a biased charge of cleaning water.

Figure 9:
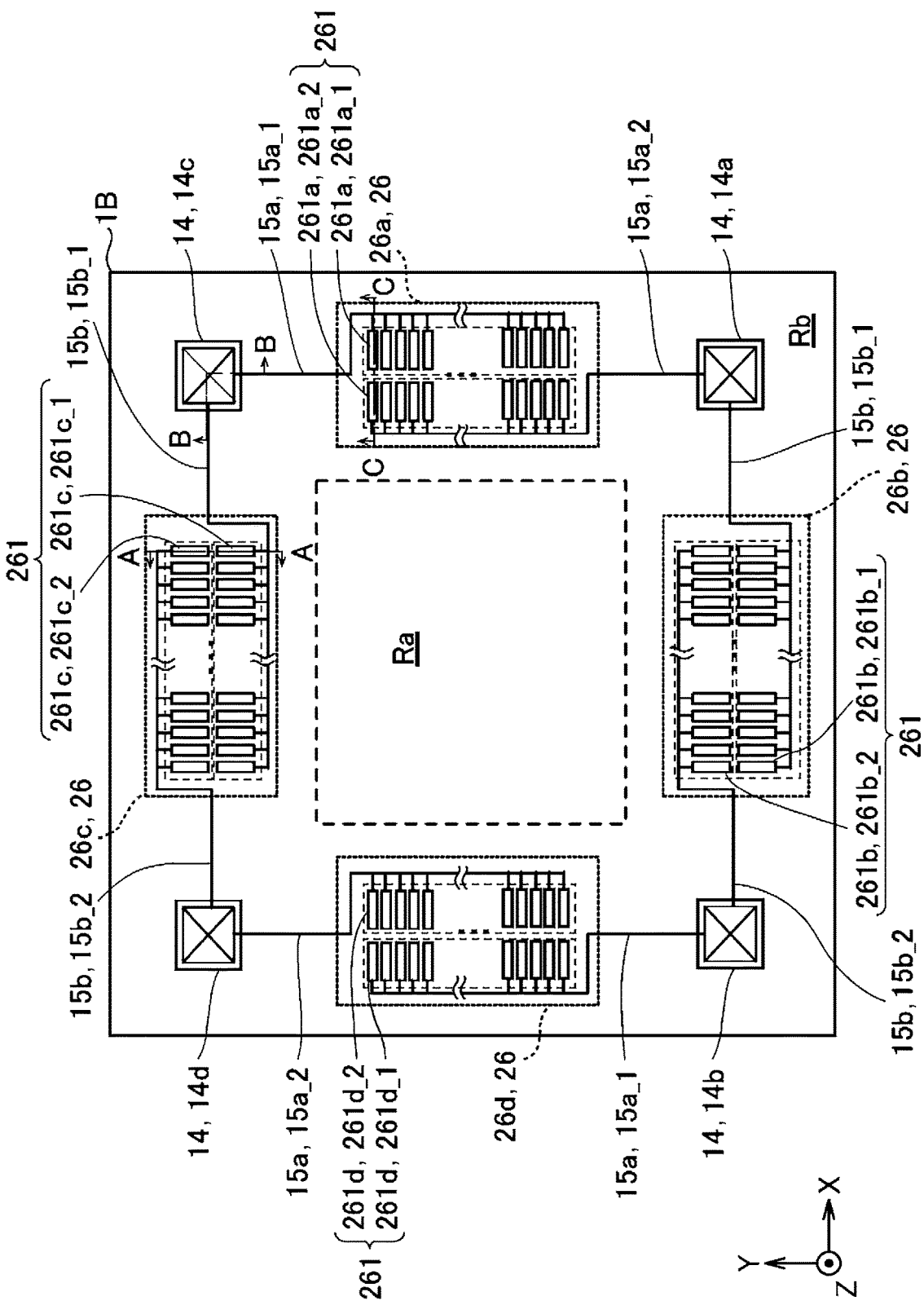
FIG. 9 is a plan view schematically showing a configuration of an imaging panel according to a third embodiment.

FIG. 9 is a schematic plan view of an imaging panel according to the present embodiment. As shown in FIG. 9, the imaging panel 1B includes a plurality of antistatic connecting wires 15a and 15b, a plurality of antistatic circuit sections 26 (26a to 26d), and four antistatic holes (14a to 14d) provided in the four corners, respectively, of the imaging panel 1B.

Each of the antistatic holes 14 (14a to 14d) overlaps an antistatic connecting wire 15a and an antistatic connecting wire 15b that are provided along two sides constituting the corner in which that antistatic hole 14 is provided.

The antistatic circuit sections 26 (26a to 26d) are disposed along the sides, respectively, of the imaging panel 1B. The antistatic circuit sections 26a to 26d each include a plurality of photodiodes (hereinafter referred to as "antistatic photodiodes) 261. In the following, when a distinction is made among the antistatic photodiodes 261 of the antistatic circuit sections 26a to 26d, the antistatic photodiodes 261 are referred to as "antistatic photodiodes 261a to 261d".

In this example, two antistatic connecting wires 15a (15a_1 and 15a_2) overlapping different antistatic holes 14 in plan view or two antistatic connecting wires 15b (15b_1 and 15b_2) overlapping different antistatic holes 14 in plan view are independently provided along a side of the frame region Rb. Specifically, for example, an antistatic connecting wire 15a_1 overlapping the antistatic hole 14c in plan view and an antistatic connecting wire 15a_2 overlapping the antistatic hole 14a in plan view are provided along the side along which the antistatic circuit section 26a is provided. Further, an antistatic connecting wire 15b_1 overlapping the antistatic hole 14c in plan view and an antistatic connecting wire 15b_2 overlapping the antistatic hole 14d in plan view are provided along the side along which the antistatic circuit section 26c is provided. An antistatic connecting wire 15a_1 overlapping the antistatic hole 14b in plan view and an antistatic connecting wire 15a_2 overlapping the antistatic hole 14d in plan view are provided along the side along which the antistatic circuit section 26d is provided. Further, an antistatic connecting wire 15a_1 overlapping the antistatic hole 14a in plan view and an antistatic connecting wire 15a_2 overlapping the antistatic hole 14b in plan view are provided along the side along which the antistatic circuit section 26b is provided.

The antistatic photodiodes 261 are each connected to either an antistatic connecting wire 15a or 15b. For example, the antistatic photodiodes 261 in the antistatic circuit sections 26a and 26d are each connected to either an antistatic connecting wire 15a_1 or 15a_2. Further, the antistatic photodiodes 261 in the antistatic circuit sections 26b and 26c are each connected to either an antistatic connecting wire 15b_1 or 15b_2.

Of the antistatic photodiodes 261a to 261d, the antistatic photodiodes 261 connected to the antistatic connecting wires 15a_1 are referred to as "antistatic photodiodes 261a_1, 261b_1, 261c_1, and 261d_1", and the antistatic photodiodes 261 connected to the antistatic connecting wires 15a_2 are referred to as "antistatic photodiodes 261a_2, 261b_2, 261c_2, and 261d_2".

The photodiodes 261 are the same in structure as the photodiodes 22 (see, for example, FIG. 5), and are fabricated at the same time as the step in which the photodiodes 22 are fabricated. The following describes connections between the antistatic wires 15a or 15b and the antistatic photodiodes 261 in concrete terms.

Figure 10A:
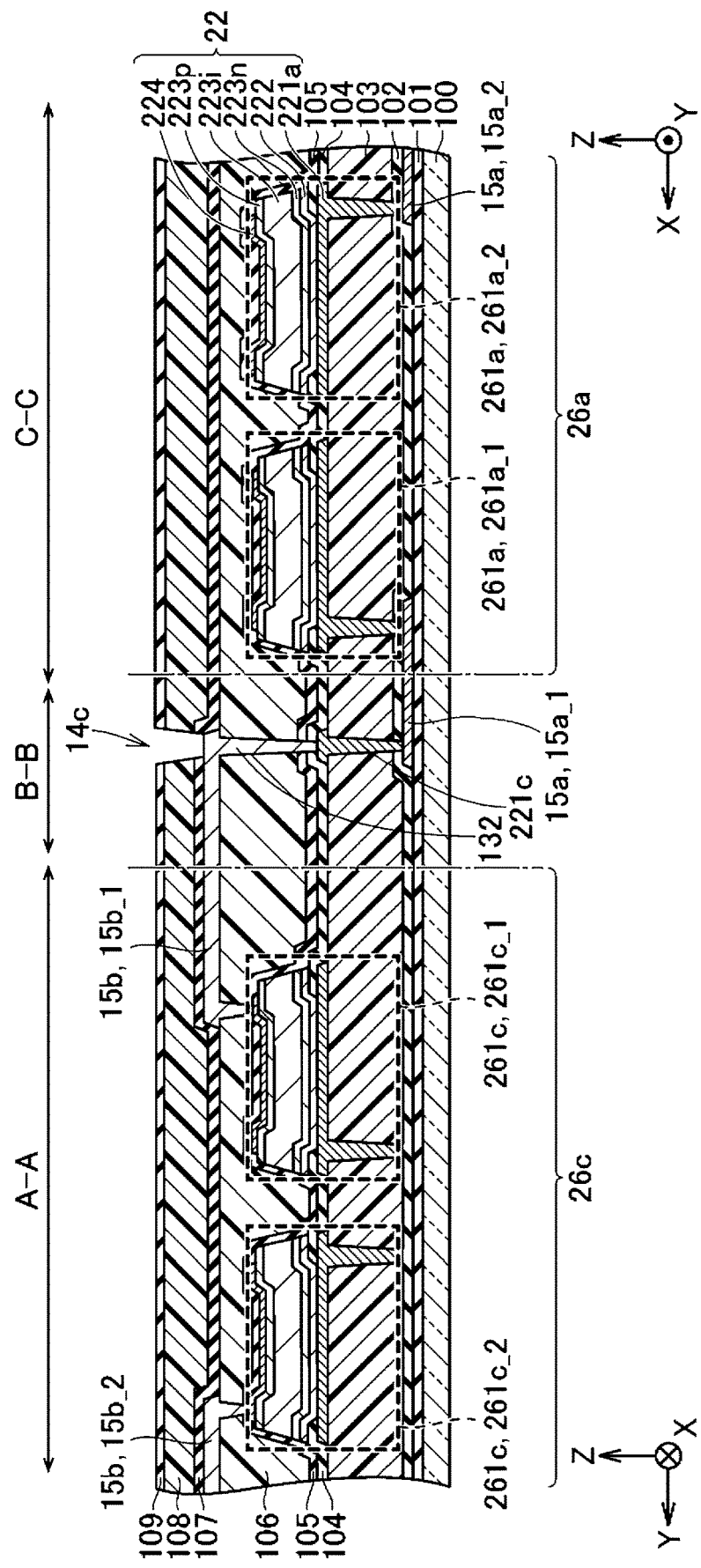
FIG. 10A illustrates schematic cross-sectional views taken along line A-A, line B-B, and line C-C, respectively, shown in FIG. 9.

FIG. 10A illustrates schematic cross-sectional views taken along line A-A, line B-B, and line C-C, respectively, shown in FIG. 9. In FIG. 10A, components which are the same as those of the first embodiment are given the same reference signs as those of the first embodiment. Although the following description is given by taking, as an example, structures of the antistatic hole 14c and the antistatic circuit sections 26a and 26c, the other antistatic holes have the same structure as the antistatic hole 14c. Further, the antistatic circuit section 26b has the same configuration as the antistatic circuit section 26c, and the antistatic circuit section 26d has the same configuration as the antistatic circuit section 26a.

As shown in FIG. 10A, the antistatic photodiodes 261a_1 and 261a_2 in the antistatic circuit section 26a have their low-level lower electrodes 221a (cathodes) connected to the antistatic connecting wires 15a_1 and 15a_2, respectively. The antistatic photodiodes 261c_1 and 261c_2 in the antistatic circuit section 26c have their upper electrodes 224 (anodes) connected to the antistatic connecting wires 15b_1 and 15b_2, respectively.

The antistatic connecting wires 15b_1 and 15b_2 are constituted by the same material as the bias wire 13, and the antistatic connecting wires 15b_1 and 15b_2 are formed integrally with the antistatic high-level wire 132. Further, the antistatic connecting wires 15a_1 and 15b_2 are constituted by the same material as the source electrode 21c and the drain electrode 21d, and are fabricated at the same time in the step in which the source electrode 21c and the drain electrode 21d are fabricated.

That is, the antistatic photodiodes 261 of the antistatic circuit sections 26a and 26d of the antistatic circuit sections 26a to 26d shown in FIG. 9 have their cathodes connected to the antistatic connecting wires 15a (15a_1 and 15a_2). Further, the antistatic photodiodes 261 of the antistatic circuit sections 26b and 26c have their anodes connected to the antistatic connecting wires 15b (15b_1 and 15b_2).

In FIG. 10A, when positively-charged cleaning water flows into the antistatic hole 14c, the electric charge of the cleaning water is canceled out by electrons from the n-type amorphous semiconductor layers 223n of the antistatic photodiodes 261a_1 via the antistatic high-level wire 132, the antistatic low-level wire 221c, and the antistatic wire 15a_1. Further, when negatively-charged cleaning water flows into the antistatic holes 14c, the electric charge of the cleaning water diffuses into the p-type amorphous semiconductor layers 223p of the antistatic photodiodes 261c_1 via the antistatic connecting wires 15b.

In the present embodiment, since the antistatic holes 14a to 14d are provided in the four corners, respectively, of the imaging panel 1B, the cleaning water flows in any antistatic hole regardless of the direction in which the imaging panel 1B faces when the imaging panel 1B passes through the air knives 216. Further, no matter whether positively-charged or negatively-charged cleaning water flows in any antistatic hole, the electric charge of the cleaning water can be removed by the antistatic photodiodes 261 via either an antistatic connecting wire 15a or 15b overlapping the antistatic hole in plan view. Therefore, the electric charge of the cleaning water is not biased toward a corner of the imaging panel 1B, and increases in dark current of the photodiodes 22 within the pixels can be prevented.

The configuration of the antistatic circuit sections 26 is not limited to that of the third embodiment. An antistatic hole 14 needs only be provided in at least one corner of the imaging panel 1B. Further, along two sides constituting a corner in which one antistatic hole 14 is provided, one antistatic connecting wire 15a and one antistatic connecting wire 15b need only be provided, and an antistatic photodiode 261 whose cathode is connected to the antistatic connecting wire 15a and an antistatic photodiode 261 whose anode is connected to the antistatic connecting wire 15b need only be provided.

Figure 10B:
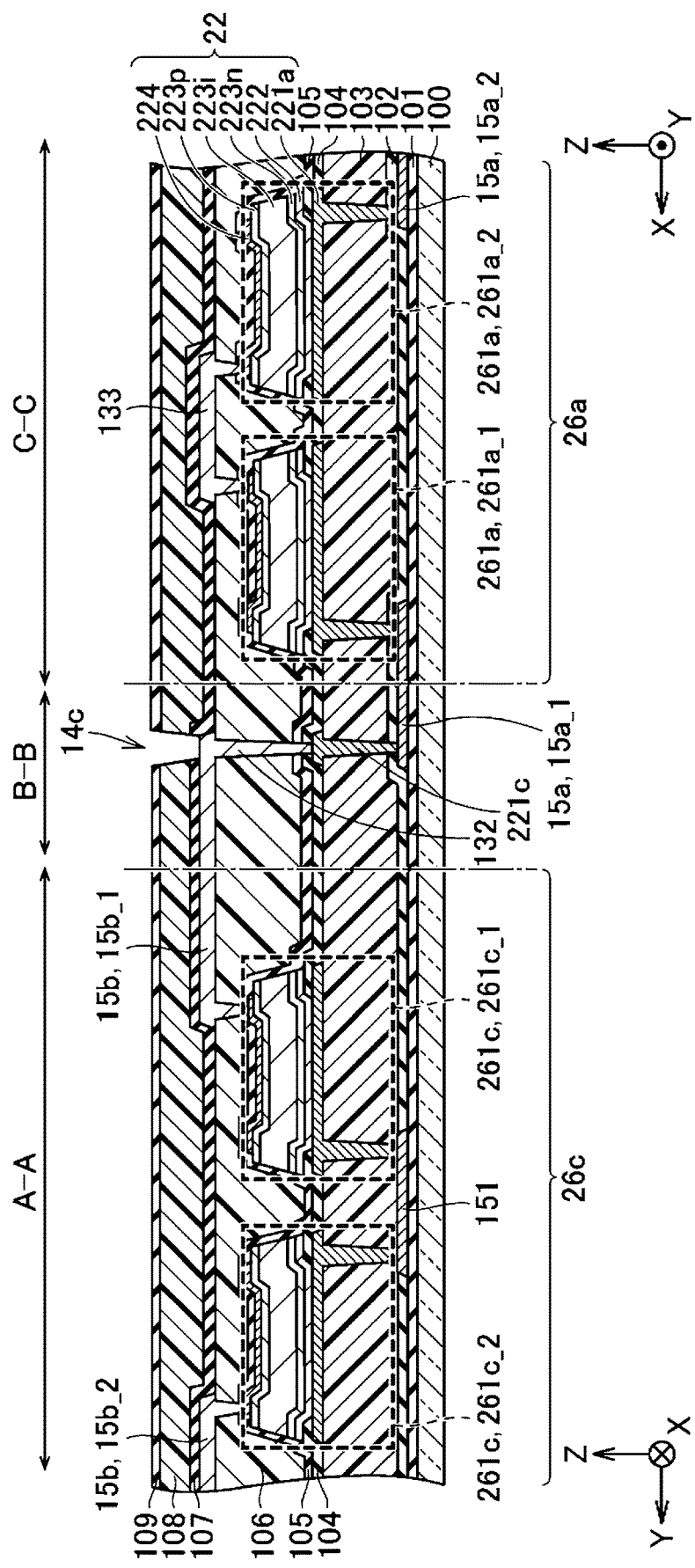
FIG. 10B is a schematic cross-sectional view of an imaging panel differing in configuration from that of FIG. 10A.

In the example shown in FIG. 9, one antistatic circuit section 26 may include two antistatic photodiodes 261 connected to two antistatic connecting wires 15a_1 and 15a_2 differing from each other or two antistatic connecting wires 15b_1 and 15b_2 differing from each other, respectively. Specifically, for example, as shown in FIG. 10B, the antistatic photodiodes 261a_1 and 261a_2 may have their upper electrodes 224 connected to each other via a relay wire 133. Further, as shown in FIG. 10B, the antistatic photodiodes 261c_1 and 261c_2 may have their low-level lower electrodes 221a connected to each other via a relay wire 151. The relay wire 133 may be formed by the same material as the bias wire 13, and the relay wire 151 may be formed by the same material as the source electrode 21c and the drain electrode 21d.

While embodiments of the present disclosure have been described above, the aforementioned embodiments are merely examples for carrying out the present disclosure. Therefore, the present disclosure is not limited to the aforementioned embodiments but can be carried out with appropriate modifications to the aforementioned embodiments without departing from the scope of the present disclosure. The following describes modifications of the present disclosure.

Figure 11A:
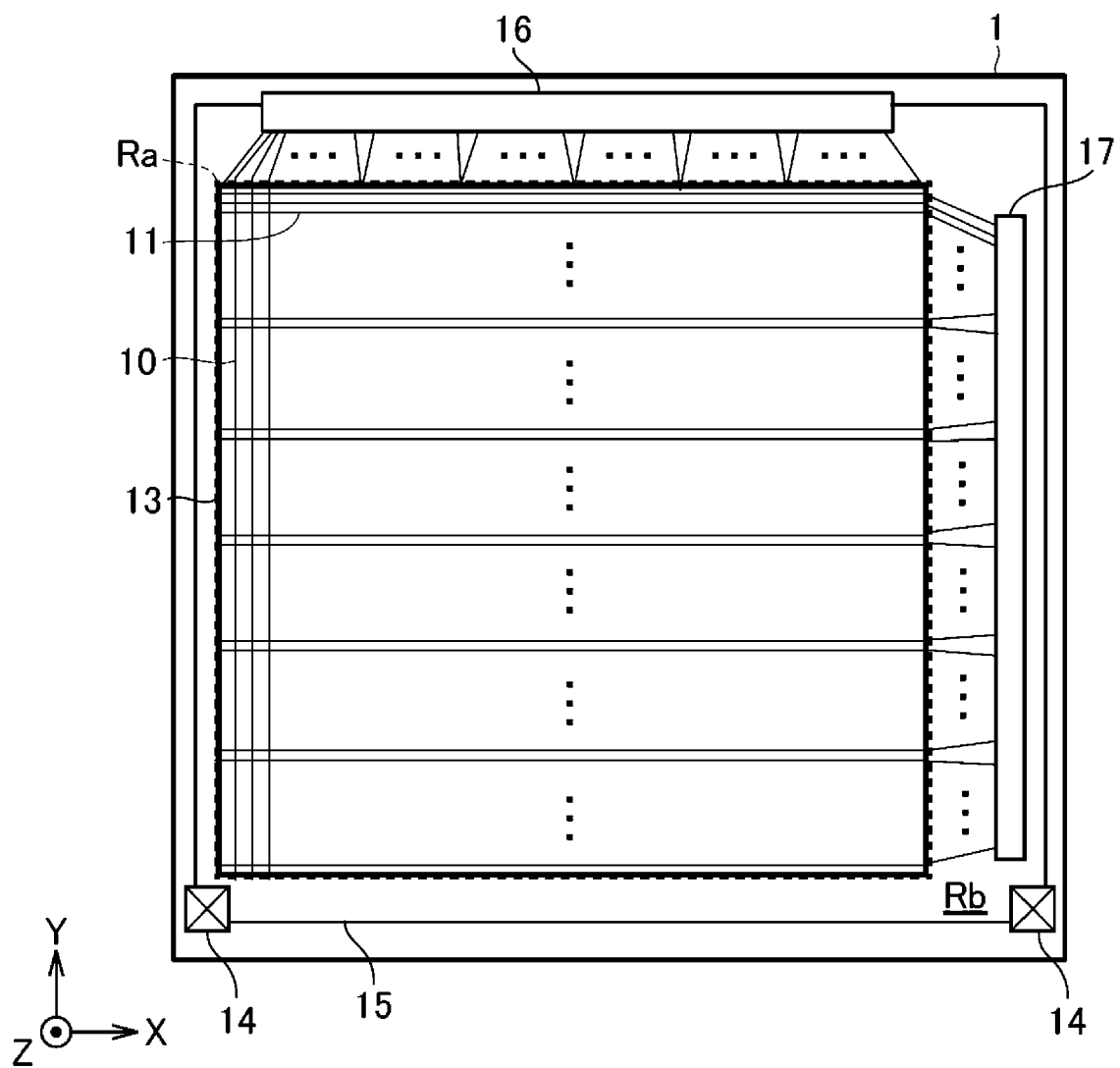
FIG. 11A is a plan view schematically showing a configuration of an imaging panel according to Modification (1)
Figure 11B:
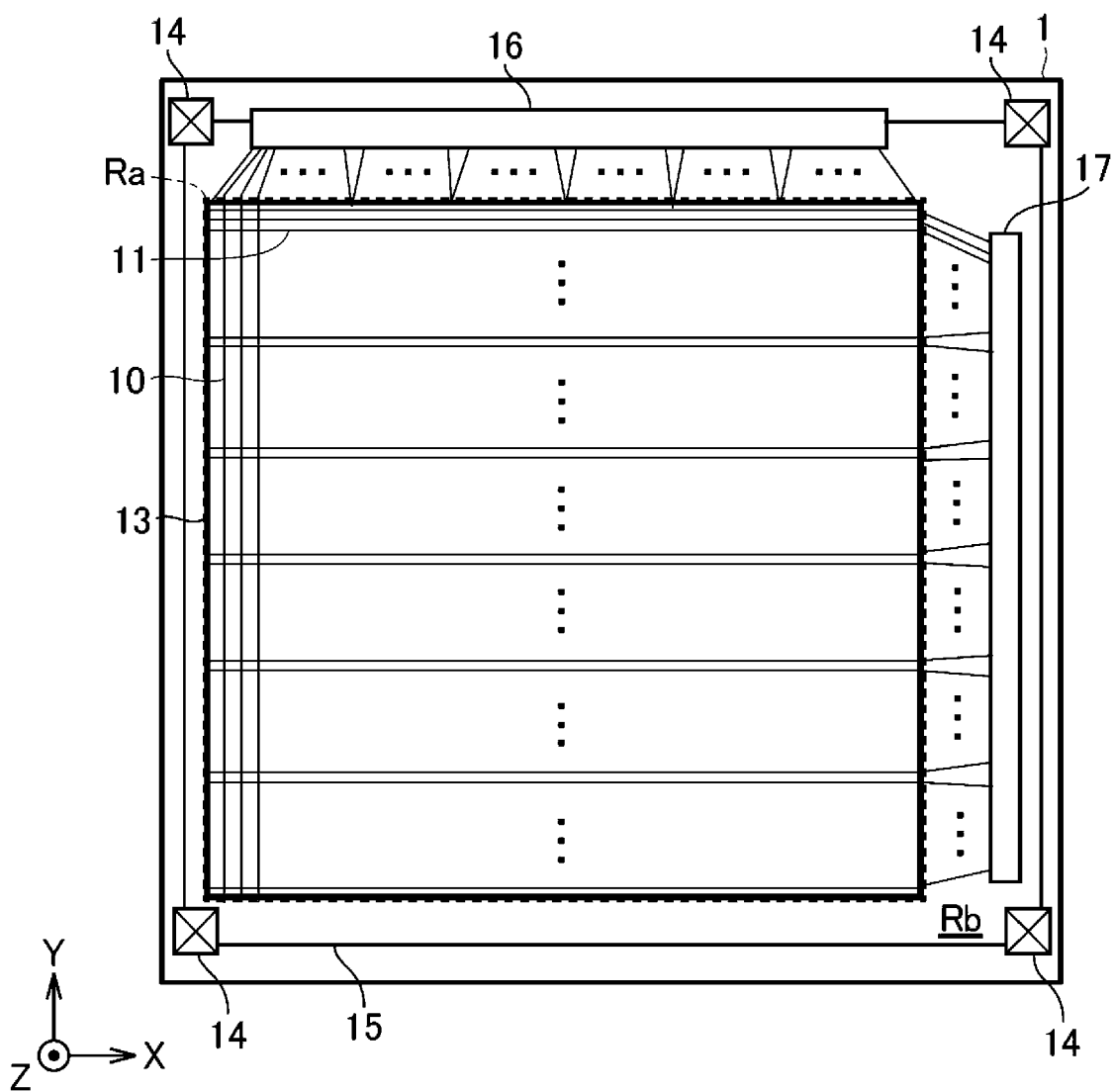
FIG. 11B is a plan view schematically showing the configuration of the imaging panel according to Modification (1), and is a plan view showing a configuration differing from that of FIG. 11A.

(1) Although the first embodiment has illustrated an example in which only one antistatic hole 14 is provided in a corner of the imaging panel 1, this is not intended to limit the number of antistatic holes 14. As shown in FIG. 11A (plan view), antistatic holes 14 may be provided in two adjacent corners over the imaging panel 1, or as shown in FIG. 11B, antistatic holes 14 may be provided in all corners over the imaging panel 1. Even in this case, as in the case of the first embodiment, an antistatic low-level wire 221c and an antistatic high-level wire 132 are stacked so as to overlap each antistatic hole 14 in plan view, so that the antistatic wire 221c and an antistatic connecting wire 15 are connected to each other. Providing a plurality of antistatic holes 14 makes it easier to adjust the position in which the imaging panel is conveyed and makes it harder for the electric charge of the cleaning water to be biased onto the imaging panel than providing one antistatic hole 14.

Figure 12:
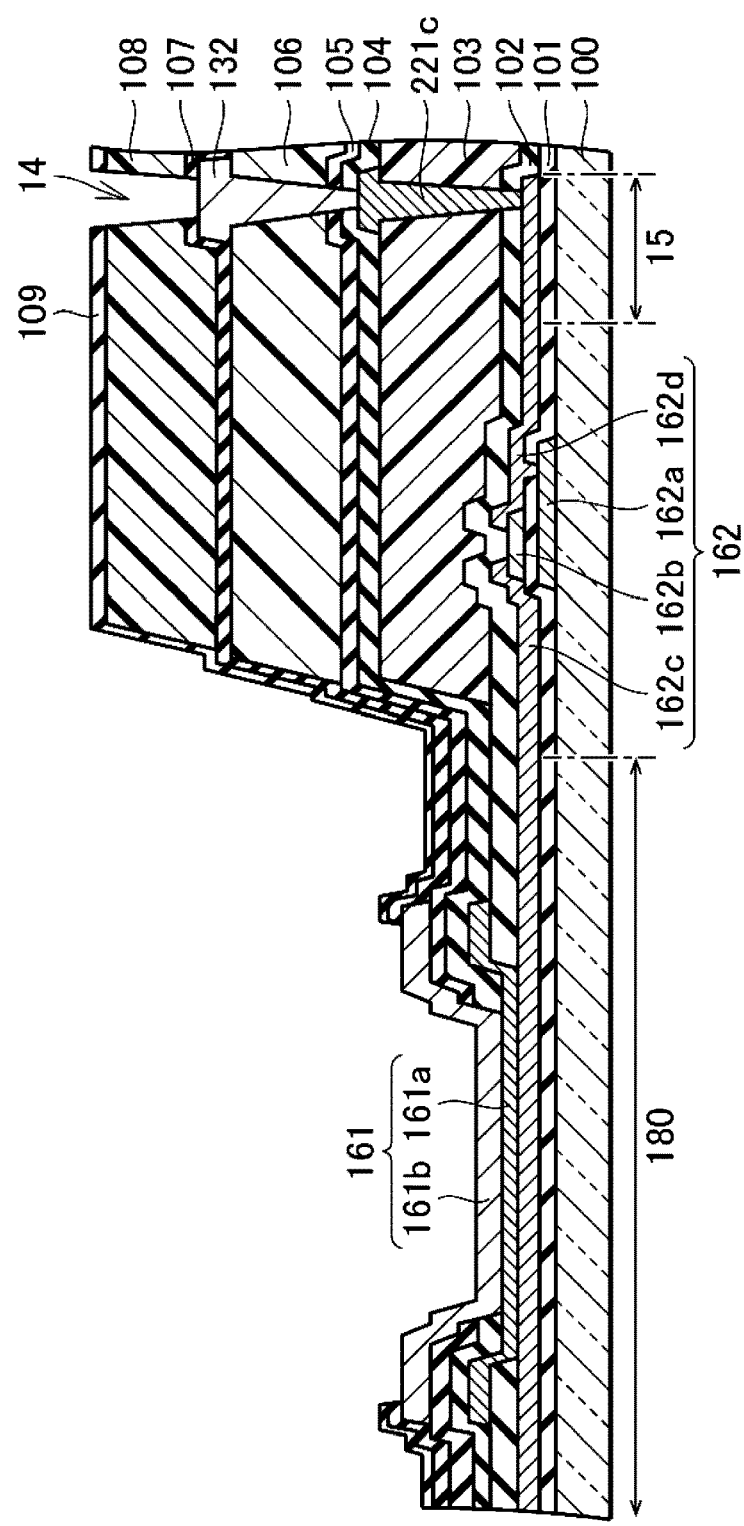
FIG. 12 is a schematic cross-sectional view of an imaging panel according to Modification (2)

(2) In the second embodiment, for example, as shown in FIG. 12, as in the case of the first embodiment, the antistatic hole 14, the antistatic high-level wire 132, and the antistatic low-level wire 221c may be provided in such a place as to overlap the antistatic wire 15 in plan view. This configuration further reduces a biased charge of the cleaning water over the imaging panel.

(3) The first and second embodiments have illustrated an example in which the antistatic wire 15 is set to a ground potential. Setting the antistatic wire 15 to a ground potential makes it possible to more certainly remove the electric charge of the antistatic wire 15 charged by the electric charge of the cleaning water. However, even in a state where the antistatic wire 15 is not set to a ground potential, the electric charge of the cleaning water is diffused into the antistatic wire 15 or canceled out by electrons from the antistatic wire 15. As a result, the electric charge of the cleaning water is hardly biased onto the imaging panel, and increases in dark current of the photodiodes 261 are prevented to some extent. Therefore, in each of the aforementioned imaging panels 1 and 1A, the antistatic wire 15 does not need to be set to a ground potential.

Figure 13:
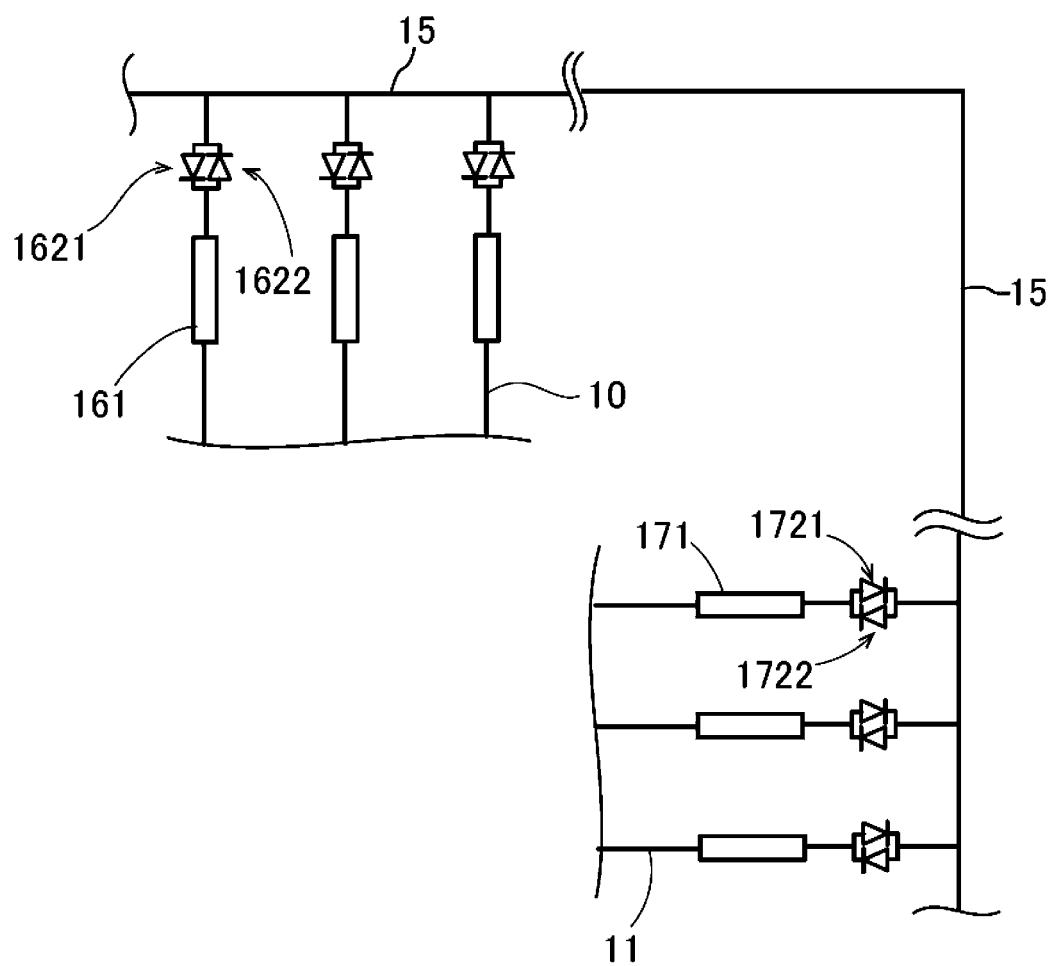
FIG. 13 is a schematic cross-sectional view of an imaging panel according to Modification (4).

(4) In the second embodiment, in a case where negatively-charged cleaning water touches a data terminal 161, the electric charge of the cleaning water can be removed; however, in a case where positively-charged cleaning water touches a data terminal 161, the non-linear element 162 becomes inversely biased, so that static removal cannot be performed. For removing the electric charge of cleaning water touching a data terminal 161, regardless of whether the cleaning water is positively or negatively charged, it is preferable that, as shown in FIG. 13, non-linear elements 1621 and 1622 be connected parallel but oriented in opposite directions to each other between the data terminal 161 and the antistatic wire 15. With this configuration, in a case where positively-charged cleaning water has touched the data terminal 161, the electric charge of the cleaning water is canceled out by electrons from the antistatic wire 15 via the non-linear element 1622. Further, in a case where negatively-charged cleaning water has touched the data terminal 161, the electric charge of the cleaning water diffuses into the antistatic wire 15 via the non-linear element 1621.

Further, as shown in FIG. 13, non-linear elements 1721 and 1722 may be connected parallel but oriented in opposite directions to each other between each gate terminal 171 and the antistatic wire 15. With this configuration, in a case where positive static electricity has entered a gate line 11, the static electricity is canceled out by electrons from the antistatic wire 15 via the non-linear element 1721, and in a case where negative static electricity has entered a gate line 11, the static electricity can be dissipated into the antistatic wire 15 via the non-linear element 1722.

(5) The second embodiment has illustrated an example in which the data terminals 161 of the first and second data protection circuit sections 16A and 16B are connected to the respective non-linear elements 162 and the non-linear elements 162 are connected to the antistatic wire 15. However, at least either the first data protection circuit section 16A or the second data protection circuit section 16B does not need to include non-linear elements 162 and may have its data terminals 161 connected directly to the antistatic wire 15.

(6) In the first embodiment, the place in which the antistatic hole 14 is provided is not limited to a corner of the imaging panel 1. The antistatic hole 14 needs only be provided in the frame region of the imaging panel 1.

An active matrix substrate that is applied to the aforementioned imaging panel can be described as follows.

In a first configuration, there is provided an active matrix substrate including: a substrate; a pixel region including a plurality of pixels formed over the substrate; a plurality of photoelectric conversion elements provided in the plurality of pixels; an antistatic wire provided in a frame region outside the pixel region so as to surround the pixel region; an insulating film covering a portion of the frame region and the pixel region; and an antistatic hole bored through the insulating film in the frame region, wherein the antistatic wire has a surface exposed in the antistatic hole.

According to the first configuration, the photoelectric conversion elements are provided separately in each of the pixels of the pixel region, and the antistatic hole and the antistatic wire are provided in the frame region. A portion of the frame region and the pixel region are covered with the insulating film. The antistatic hole is bored through the insulating film, and the surface of the antistatic wire is exposed in the antistatic hole. When the active matrix substrate is cleaned in a charged state in the process of manufacturing the active matrix substrate, the cleaning water having touched the active matrix substrate becomes charged. In a case where the cleaning water is negatively charged, the flow of the cleaning water into the antistatic hole causes the electric charge of the cleaning water to diffuse into the antistatic wire. Further, in a case where the cleaning water is positively charged, the electric charge of the cleaning water is canceled out by electrons from the antistatic wire. Therefore, the electric charge of the cleaning water is not biased toward pixels around the antistatic hole, and increases in dark current of the photoelectric conversion elements can be prevented.

In the first configuration, the antistatic wire may include a first wiring layer surrounding the pixel region and a second wiring layer overlapped with the antistatic hole in plan view and connected to the first wiring layer, and the second wiring layer may have a surface exposed in the antistatic hole (second configuration).

According to the second configuration, in a case where the cleaning water having touched the second wiring layer is negatively charged, the electric charge of the cleaning water diffuses into the first wiring layer provided around the pixel region, and in a case where the cleaning water is positively charged, the electric charge of the cleaning water is canceled out by electrons from the first wiring layer.

In the first or second configuration, the active matrix substrate may further include a plurality of data lines and a plurality of data terminals connected to first ends of the plurality of data lines, respectively, and the plurality of data terminals may be connected to the antistatic wire (third configuration).

According to the third configuration, when the active matrix substrate has been cleaned, the cleaning water flows in the antistatic hole and over the data terminals. In a case where the cleaning water is negatively charged, the electric charge diffuses into the antistatic wire from the data terminal and the antistatic hole. In a case where the cleaning water is positively charged, the electric charge of the cleaning water in the antistatic hole and over the data terminals is canceled out by electrons from the antistatic wire. Therefore, the electric charge of the cleaning water is hardly biased onto the active matrix substrate, and increases in dark current of the photoelectric conversion elements can be prevented.

In any of the first to third configurations, the antistatic hole may be provided in at least one corner over the substrate in the frame region (fourth configuration).

According to the fourth configuration, in a case where the cleaning water easily accumulates in a corner over the active matrix substrate, the electric charge of the cleaning water is hardly biased toward pixels around the corner over the active matrix substrate, and increases in dark current of the photoelectric conversion elements in those pixels can be prevented.

In the first configuration, the active matrix substrate may further include a first antistatic wire provided along a first side of two sides constituting a corner in which the antistatic hole is provided, a second antistatic wire provided along a second side of the two sides, a first antistatic photoelectric conversion element, provided along the first side in the frame region, that has an anode connected to the first antistatic wire, and a second antistatic photoelectric conversion element, provided along the second side in the frame region, that has a cathode connected to the second antistatic wire, the first antistatic wire may have a surface exposed in the antistatic hole, and the second antistatic wire may be electrically connected to the first antistatic wire in the antistatic hole (fifth configuration).

According to the fifth configuration, the first antistatic wire and the second antistatic wire are provided along the two sides, respectively, constituting the corner in which the antistatic hole in the frame region. The first antistatic photoelectric conversion element is provided along the side along which the first antistatic wire is provided in the frame region, and has its anode connected to the first antistatic wire. Moreover, the second antistatic photoelectric conversion element is provided along the side along which the second antistatic wire is provided in the frame region, and has its cathode connected to the second antistatic wire. The surface of the first antistatic wire is exposed in the antistatic hole, and the second antistatic wire is electrically connected to the first antistatic wire. Therefore, in the step of cleaning the active matrix substrate, in a case where positively-charged cleaning water has flowed in the antistatic hole, the electric charge of the cleaning water is canceled out by electrons from the cathode of the second antistatic photoelectric conversion element via the first antistatic wire and the second antistatic wire. Further, in a case where negatively-charged cleaning water has flown in the antistatic hole, the electric charge of the cleaning water diffuses into the anode of the first antistatic photoelectric conversion element via the first antistatic wire. As a result, the electric charge of the cleaning water is not biased toward at least one corner over the active matrix substrate, and increases in dark current of the photoelectric conversion elements in pixels around the corner can be prevented.

In the fifth configuration, a plurality of the first antistatic photoelectric conversion elements and a plurality of the second first antistatic photoelectric conversion elements may be provided (sixth configuration).

As compared with a case where one first antistatic photoelectric conversion element and one second antistatic photoelectric conversion element are provided, the sixth configuration enhances the capability of removing the electric charge of charged cleaning water, and can therefore further reduce a biased charge of the cleaning water over the active matrix substrate.

In a seventh configuration, an active matrix substrate includes a substrate, a pixel region including a plurality of pixels formed over the substrate, a plurality of photoelectric conversion elements provided in the plurality of pixels, a plurality of data lines formed over the substrate, a plurality of first terminals connected to first ends of the plurality of data lines, respectively, in a frame region outside the pixel region, an antistatic wire provided in the frame region so as to surround the pixel region and electrically connected to the plurality of first terminals, and a plurality of protection elements connected between respective ones of the plurality of first terminals and the antistatic wire, and each of the plurality of protection elements includes a first non-linear element connected between a first terminal and the antistatic wire.

According to the seventh configuration, the photoelectric conversion elements are provided separately in each of the pixels of the pixel region formed over the substrate, and the plurality of data lines are provided over the substrate. In the frame region, the plurality of first terminals connected to the first ends of the plurality of data lines, the antistatic wire surrounding the pixel region, and the first non-linear elements connected between the antistatic wire and the first terminals are provided. Therefore, in a case where cleaning water having touched the active matrix substrate becomes charged in cleaning the active matrix substrate, the cleaning water charged to either a positive or negative polarity touches the first terminals. In this case, the electric charge of the cleaning water is canceled out by electrons from the antistatic wire via the first non-linear elements, or the electric charge of the cleaning water can diffuse into the antistatic wire via the first non-linear elements. Therefore, in a case where the cleaning water easily accumulates in the region in which the first terminals are provided, the electric charge of the cleaning water is not biased toward the region, and increases in dark current of the photoelectric conversion elements in pixels around the region can be prevented.

In the seventh configuration, each of the plurality of protection elements may include, between a first terminal and the antistatic wire, a second non-linear element connected parallel but oriented in an opposite direction to the first non-linear element (eighth configuration).

According to the eighth configuration, the electric charge of the cleaning water, depending on the polarity of the electric charge, is canceled out by electrons from the antistatic wire via either of the first non-linear element and the second non-linear element and diffused into the antistatic wire via the other of the first non-linear element and the second non-linear element. Therefore, as compared with a case where only the first non-linear element is provided, a dark current of the photoelectric conversion element that increases due to the influence of the electric charge of the cleaning water can be further reduced.

In the seventh or eighth configuration, the active matrix substrate may further include a plurality of second terminals connected to second ends of the plurality of data lines, respectively, in the frame region, and the plurality of second terminals may be connected to the antistatic wire in the frame region (ninth configuration).

According to the ninth configuration, the second terminals are connected to the second ends of the data lines, and the second terminals and the antistatic wire are connected to each other. Therefore, even in a case where charged cleaning water has touched the second terminals, the electric charge of the cleaning water is removed by the antistatic wire, as in the case of the first terminals. As compared in a case where only the first terminals are provided, this enhances the capability of removing the electric charge of the cleaning water, and can further reduce a biased charge of the cleaning water over the active matrix substrate.

A method for inspecting an active matrix substrate is a method for inspecting an active matrix substrate including a pixel region including a plurality of pixels defined by a plurality of data lines and a plurality of gate lines both formed over a substrate, a plurality of photoelectric conversion elements provided in the plurality of pixels and connected to the plurality of data lines, an antistatic wire provided in a frame region outside the pixel region so as to surround the pixel region, an insulating film covering a portion of the frame region and the pixel region, and an antistatic hole bored through the insulating film in the frame region, the antistatic wire having a surface exposed in the antistatic hole, the method including: setting the antistatic wire to a predetermined reference potential; and scanning the plurality of gate lines and acquiring data signals from the plurality of data lines (tenth configuration).

According to the tenth configuration, in the active matrix substrate in which the photoelectric conversion elements are provided separately in each of the pixels of the pixel region and the antistatic hole and the antistatic wire are provided in the frame region, the pixel region and a portion of the frame region are covered with the insulating film. The antistatic hole is bored through the insulating film, and the surface of the antistatic wire is exposed in the antistatic hole. In a case where a surface of the active matrix substrate is cleaned before the step of inspecting the active matrix substrate, cleaning the active matrix substrate in a charged state charges cleaning water having touched the active matrix substrate. When the charged cleaning water flows in the antistatic hole, the antistatic wire becomes charged by the electric charge of the cleaning water. After the cleaning process, the electric charge of the antistatic wire thus charged is removed by setting the antistatic wire to a predetermined reference potential. Therefore, dark currents of the photoelectric conversion elements in the active matrix substrate hardly increase due to the electric charge of the cleaning water, and appropriate data signals can be obtained from the plurality of data lines.

The present disclosure contains subject matter related to that disclosed in U.S. Provisional Patent Application No. 62/871,633 filed in the United States Patent Office on Jul. 8, 2019, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An active matrix substrate comprising:
   a substrate;
   a pixel region including a plurality of pixels formed over the substrate;
   a plurality of photoelectric conversion elements provided in the plurality of pixels;
   an antistatic wire provided in a frame region outside the pixel region so as to surround the pixel region;
   an insulating film covering a portion of the frame region and the pixel region; and
   an antistatic hole bored through the insulating film in the frame region,
   wherein the antistatic wire has a surface exposed in the antistatic hole.

2. The active matrix substrate according to claim 1, wherein
   the antistatic wire includes a first wiring layer surrounding the pixel region and a second wiring layer overlapped with the antistatic hole in plan view and connected to the first wiring layer, and
   the second wiring layer has a surface exposed in the antistatic hole.

3. The active matrix substrate according to claim 1, further comprising:
   a plurality of data lines; and
   a plurality of data terminals connected to first ends of the plurality of data lines, respectively,
   wherein the plurality of data terminals are connected to the antistatic wire.

4. The active matrix substrate according to claim 1, wherein the antistatic hole is provided in at least one corner over the substrate in the frame region.

5. The active matrix substrate according to claim 4, further comprising:
   a first antistatic wire provided along a first side of two sides constituting a corner in which the antistatic hole is provided;
   a second antistatic wire provided along a second side of the two sides;
   a first antistatic photoelectric conversion element, provided along the first side in the frame region, that has an anode connected to the first antistatic wire; and
   a second antistatic photoelectric conversion element, provided along the second side in the frame region, that has a cathode connected to the second antistatic wire,
   wherein
   the first antistatic wire has a surface exposed in the antistatic hole, and
   the second antistatic wire is electrically connected to the first antistatic wire in the antistatic hole.

6. The active matrix substrate according to claim 5, wherein a plurality of the first antistatic photoelectric conversion elements and a plurality of the second first antistatic photoelectric conversion elements are provided.

7. An active matrix substrate comprising:
a substrate;
a pixel region including a plurality of pixels formed over the substrate;
a plurality of photoelectric conversion elements provided in the plurality of pixels;
a plurality of data lines formed over the substrate;
a plurality of first terminals connected to first ends of the plurality of data lines, respectively, in a frame region outside the pixel region;
an antistatic wire provided in the frame region so as to surround the pixel region and electrically connected to the plurality of first terminals; and
a plurality of protection elements connected between respective ones of the plurality of first terminals and the antistatic wire,
wherein each of the plurality of protection elements includes a first non-linear element connected between a first terminal and the antistatic wire.

8. The active matrix substrate according to claim 7, wherein each of the plurality of protection elements includes, between a first terminal and the antistatic wire, a second non-linear element connected parallel but oriented in an opposite direction to the first non-linear element.

9. The active matrix substrate according to claim 7, further comprising a plurality of second terminals connected to second ends of the plurality of data lines, respectively, in the frame region,
wherein the plurality of second terminals are connected to the antistatic wire in the frame region.

* * * * *